United States Patent
Dazai et al.

(10) Patent No.: US 7,741,009 B2
(45) Date of Patent: Jun. 22, 2010

(54) POSITIVE RESIST COMPOSITION AND METHOD OF FORMING RESIST PATTERN

(75) Inventors: Takahiro Dazai, Kawasaki (JP); Hiroaki Shimizu, Kawasaki (JP); Kyoko Ohshita, Kawasaki (JP); Komei Hirahara, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/174,804

(22) Filed: Jul. 17, 2008

(65) Prior Publication Data
US 2009/0023097 A1 Jan. 22, 2009

(30) Foreign Application Priority Data
Jul. 20, 2007 (JP) .............................. 2007-189454

(51) Int. Cl.
G03F 7/039 (2006.01)
G03F 7/20 (2006.01)
G03F 7/30 (2006.01)

(52) U.S. Cl. .................... 430/270.1; 430/326; 430/910; 430/921; 430/925

(58) Field of Classification Search .................. None
See application file for complete search history.

(56) References Cited

U.S. PATENT DOCUMENTS

| 5,548,055 | A | 8/1996 | Narang et al. | |
|---|---|---|---|---|
| 5,945,517 | A | 8/1999 | Nitta et al. | |
| 6,180,313 | B1 | 1/2001 | Yukawa et al. | |
| 6,624,328 | B1 | 9/2003 | Guerra | |
| 7,074,543 | B2 | 7/2006 | Iwai et al. | |
| 2004/0087690 | A1* | 5/2004 | Lamanna et al. | 524/155 |
| 2007/0134588 | A1* | 6/2007 | Kanda et al. | 430/270.1 |
| 2008/0311522 | A1* | 12/2008 | Iwai et al. | 430/286.1 |
| 2009/0023095 | A1* | 1/2009 | Hada et al. | 430/281.1 |

FOREIGN PATENT DOCUMENTS

| JP | H09-208554 | 8/1997 |
|---|---|---|
| JP | H11-35551 | 2/1999 |
| JP | H11-35552 | 2/1999 |
| JP | H11-35573 | 2/1999 |
| JP | 11-502543 | 3/1999 |
| JP | H11-322707 | 11/1999 |
| JP | 2003-241385 | 8/2003 |
| JP | 2006-348382 | 12/2006 |
| WO | WO 2004/074242 | 9/2004 |

OTHER PUBLICATIONS

Ayothi et al ("Acrylonium Photoacid Generators Containing Environmentally Compatible Aryloxyperfluoroalkanesulfonate Groups", Chemistry of Materials, (2007), vol. 19, issue 6, p. 1434-1444).*

* cited by examiner

*Primary Examiner*—Sin J. Lee
(74) *Attorney, Agent, or Firm*—Knobbe, Martens, Olson & Bear LLP

(57) ABSTRACT

A positive resist composition including a resin component (A) which exhibits increased solubility in an alkali developing solution under action of acid and has a structural unit (a1) represented by general formula (a1-0-2) shown below, and an acid-generator component (B) which generates acid upon exposure and includes an acid generator (B1) consisting of a compound represented by general formula (b1-12) shown below:

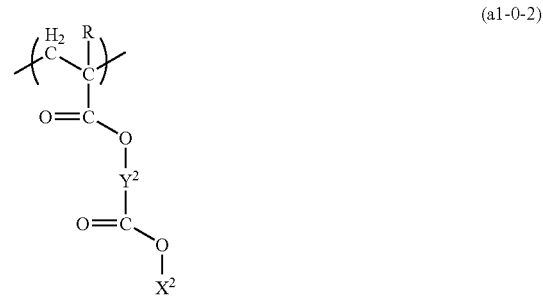

(a1-0-2)

wherein R represents a hydrogen atom, a lower alkyl group or a halogenated lower alkyl group; $X^2$ represents an acid dissociable, dissolution inhibiting group; and $Y^2$ represents an alkylene group or a divalent aliphatic cyclic group; and $$R^2-O-Y^1-SO_3^--A^+ \quad (b1\text{-}12)$$

wherein $R^2$ represents a monovalent aromatic organic group; $Y^1$ represents an alkylene group of 1 to 4 carbon atoms which may be substituted with a fluorine atom; and $A^+$ represents a cation.

5 Claims, No Drawings

POSITIVE RESIST COMPOSITION AND METHOD OF FORMING RESIST PATTERN

TECHNICAL FIELD

The present invention relates to a positive resist composition containing a preferable acid generator, and a method of forming a resist pattern using the positive resist composition.

Priority is claimed on Japanese Patent Application No. 2007-189454, filed Jul. 20, 2007, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under action of acid and an acid generator that generates acid upon exposure. For example, a chemically amplified positive resist contains, as a base resin, a resin which exhibits increased solubility in an alkali developing solution under action of acid, and an acid generator. In the formation of a resist pattern, when acid is generated from the acid generator upon exposure, the exposed portions become soluble in an alkali developing solution.

Until recently, polyhydroxystyrene (PHS) or derivative resins thereof in which the hydroxyl groups are protected with acid-dissociable, dissolution-inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as base resins for resists that use ArF excimer laser lithography, as they exhibit excellent transparency in the vicinity of 193 nm. In the case of a positive resist, as the base resin, those which have a structural unit derived from (meth)acrylate ester including an aliphatic polycyclic group-containing, tertiary alkyl ester-type acid dissociable, dissolution inhibiting group, such as a structural unit derived from 2-alkyl-2-adamantyl(meth)acrylate are mainly used (for example, see Patent Document 1).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

[Patent Document 1] Japanese Unexamined Patent Application, First Publication No. 2003-241385

DISCLOSURE OF INVENTION

Means to Solve the Problems

In recent years, as the miniaturization of resist patterns progress, not only high resolutions, but also improvement in various lithography properties has been demanded.

In particular, improvement in the mask reproducibility of the resist pattern formed has been demanded as the miniaturization of resist patterns progress. For example, with respect to a contact hole (C/H) pattern formed, the uniformity (CDU) of the hole diameter and circularity of the holes are yardsticks for mask reproducibility, and improvement of these properties becomes important in improving the lithography properties.

The present invention takes the above circumstances into consideration, with an object of providing a positive resist composition and method of forming a resist pattern, which enable formation of a contact hole (C/H) pattern with hole diameter of excellent uniformity and holes having excellent circularity.

Means to Solve the Problems

For solving the above-mentioned problems, the present invention employs the following aspects. A first aspect of the present invention is a positive resist composition including a resin component (A) which exhibits increased solubility in an alkali developing solution under action of acid and an acid-generator component (B) which generates acid upon exposure, the resin component (A) having a structural unit (a1) represented by general formula (a1-0-2) shown below:

[Chemical Formula 1]

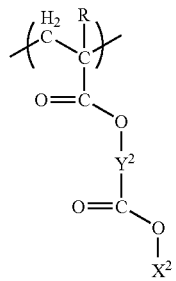
(a1-0-2)

wherein R represents a hydrogen atom, a lower alkyl group or a halogenated lower alkyl group; $X^2$ represents an acid dissociable, dissolution inhibiting group; and $Y^2$ represents an alkylene group or a divalent aliphatic cyclic group; and the acid-generator component (B) including an acid generator (B1) consisting of a compound represented by general formula (b1-12) shown below:

$$R^2-O-Y^1-SO_3^-A^+ \quad\quad (b1\text{-}12)$$

wherein $R^2$ represents a monovalent aromatic organic group; $Y^1$ represents an alkylene group of 1 to 4 carbon atoms which may be substituted with a fluorine atom; and $A^+$ represents a cation.

Further, a second aspect of the present invention is a method of forming a resist pattern, including: applying a positive resist composition of the abovementioned first aspect of the present invention to a substrate to form a resist film on the substrate; conducting exposure of the resist film; and alkali-developing the resist film to form a resist pattern.

In the present description and claims, the term "structural unit" refers to a monomer unit that contributes to the formation of a resin component (polymer).

The term "exposure" is used as a general concept that includes irradiation with any form of radiation.

Effect of the Invention

According to the present invention, there are provided a positive resist composition and method of forming a resist pattern, which enable formation of a contact hole (C/H) pattern with hole diameter of excellent uniformity and holes having excellent circularity.

BEST MODE FOR CARRYING OUT THE INVENTION

Hereinbelow, the present invention will be described in detail.

<<Positive Resist Composition>>

The positive resist composition of the present invention includes a resin component (A) (hereafter, frequently referred to as "component (A)") which exhibits increased solubility in an alkali developing solution under action of acid and an acid-generator component (B) (hereafter, frequently referred to as "component (B)") which generates acid upon irradiation.

In the positive resist composition of the present invention, the component (A) prior to exposure is insoluble in an alkali developing solution. When acid is generated from the component (B) upon exposure, the acid dissociable, dissolution inhibiting groups are dissociated. As a result, the solubility of the entire component (A) in an alkali developing solution is increased, and hence, the component (A) changes from alkali insoluble to alkali soluble. Therefore, in the formation of a resist pattern by conducting selective exposure of a resist film formed by using the positive resist composition of the present invention, the exposed portions become alkali soluble, whereas the unexposed portions remain alkali insoluble, and hence, a resist pattern can be formed by alkali developing.

<Component (A)>

In the present invention, the component (A) has a structural unit (a1) represented by general formula (a1-0-2) above.

It is preferable that the component (A) father has a structural unit (a'1) is derived from an acrylate ester having an acid dissociable, dissolution inhibiting group, which other than the structural unit (a1).

It is preferable that the component (A) further has a structural unit (a2) derived from an acrylate ester having a lactone-containing cyclic group.

It is preferable that the component (A) further has a structural unit (a3) derived from an acrylate ester having a polar group-containing aliphatic hydrocarbon group.

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

An "alkyl group" includes linear, branched or cyclic, monovalent saturated hydrocarbon, unless otherwise specified.

A "lower alkyl group" is an alkyl group of 1 to 5 carbon atoms.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

Specific examples of the halogenated lower alkyl group include groups in which some or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

—Structural Unit (a1)

The structural unit (a1) is a structural unit represented by general formula (a1-0-2) above.

In general formula (a1-0-2) above, R represents a hydrogen atom, a lower alkyl group or a halogenated lower alkyl group. As the lower alkyl group or halogenated lower alkyl group for R, the same as the lower alkyl group or halogenated lower alkyl group which can be bonded to the α-position of the aforementioned acrylate ester may be exemplified. Among these, a hydrogen atom or a methyl group is preferable, and a methyl group is particularly desirable.

$X^2$ is not particularly limited as long as it is an acid dissociable, dissolution inhibiting group. As the acid dissociable, dissolution inhibiting group, any of the groups that have been proposed as acid dissociable, dissolution inhibiting groups for the base resins of chemically amplified resists can be used, provided the group has an alkali dissolution-inhibiting effect that renders the entire component (A) alkali-insoluble prior to dissociation, and then following dissociation by action of acid, causes the entire component (A) to change to an alkali-soluble state. Generally, groups that form either a cyclic or chain-like tertiary alkyl ester with the carboxyl group of a (meth)acrylate ester, and acetal-type acid dissociable, dissolution inhibiting groups such as alkoxyalkyl groups are widely known. In the present description, the term "(meth) acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity. The "aliphatic branched, acid dissociable, dissolution inhibiting group" is not limited to be constituted of only carbon and hydrogen (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, lower alkoxy groups of 1 to 5 carbon atoms, fluorine atom, fluorinated lower alkyl groups of 1 to 5 carbon atoms, and oxygen atom (═O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the aliphatic cyclic groups is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclodecanyl group, and a branched alkylene group having a tertiary carbon atom bonded thereto, as in the structural units represented by general formulas (a1″-1) to (a1″-6) shown below, can be exemplified.

[Chemical Formula 2]

(a1″-1)

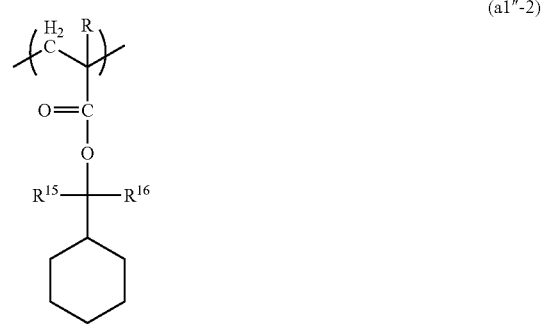

(a1″-2)

-continued

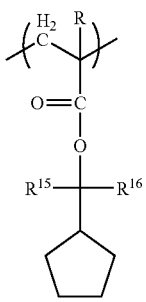
(a1″-3)

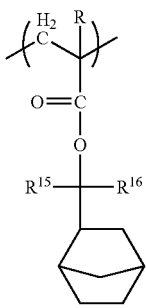
(a1″-4)

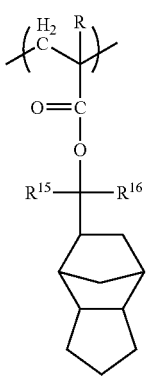
(a1″-5)

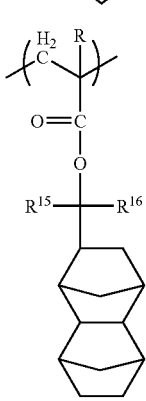
(a1″-6)

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

An "acetal-type acid dissociable, dissolution inhibiting group" is generally substituted with a hydrogen atom at the terminal of an alkali-soluble group such as a carboxy group or hydroxyl group, so as to be bonded with an oxygen atom. When acid is generated upon exposures the generated acid acts to break the bond between the acetal-type acid dissociable, dissolution inhibiting group and the oxygen atoms to which the acetal-type, acid dissociable, dissolution inhibiting group is bonded.

Examples of acetal-type acid dissociable, dissolution inhibiting groups include groups represented by general formula (p1) shown below.

[Chemical Formula 3]

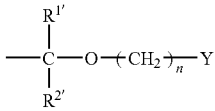
(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be exemplified. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below,

[Chemical Formula 4]

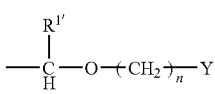
(p1-1)

wherein $R^{1\prime}$, n and Y are as defined above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified,

[Chemical Formula 5]

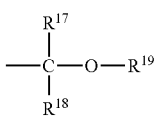
(p2)

wherein $R^{17}$ and $R^{18}$ each independently represents a linear or branched allyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

$Y^2$ represents an alkylene group or a divalent aliphatic cyclic group. As the aliphatic cyclic group, the same as those exemplified above in connection with the explanation of "aliphatic cyclic group" can be used, except that two hydrogen atoms have been removed therefrom.

When $Y^2$ is an alkylene group, it is preferably an alkylene group of 1 to 10 carbon atoms, more preferably 1 to 6 carbon atoms, still more preferably 1 to 4 carbon atoms, and most preferably 1 to 3 carbon atoms.

When $Y^2$ is a divalent aliphatic cyclic group, it is particularly desirable that the divalent aliphatic cyclic group is a group in which two or more hydrogen atoms have been removed from cyclopentane, cyclohexane, norbornane, isobornane, adamantane, tricyclodecane or tetracyclododecane.

Specific examples of structural units represented by general formula (a1-0-2) above are shown below.

[Chemical Formula 6]

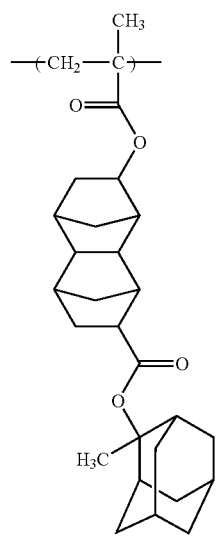

(a1-3-1)

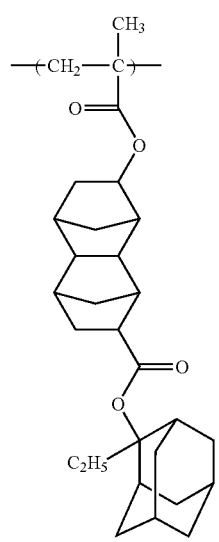

(a1-3-2)

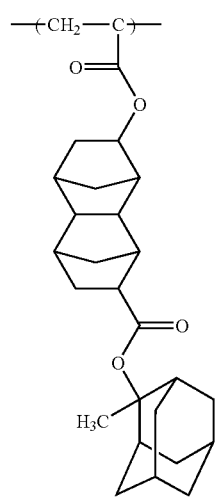

(a1-3-3)

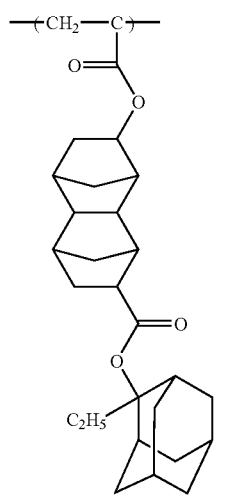
(a1-3-4)
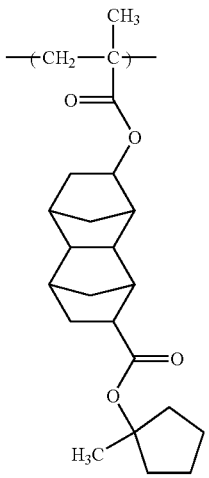
(a1-3-7)
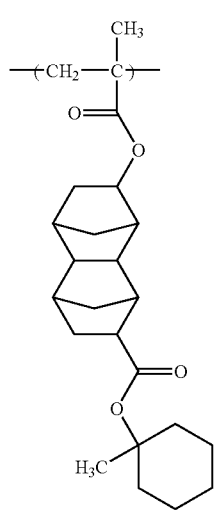
(a1-3-5)
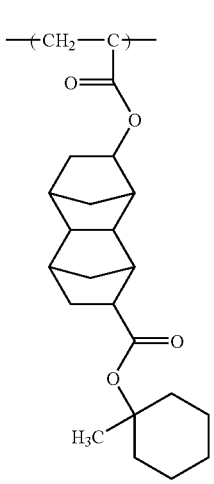
(a1-3-8)
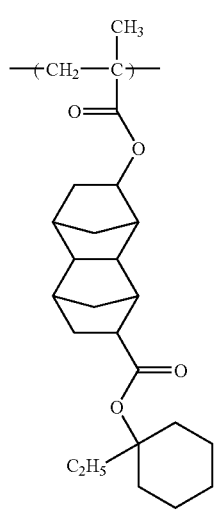
(a1-3-6)
(a1-3-9)

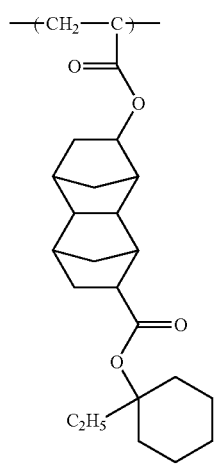
(a1-3-10)
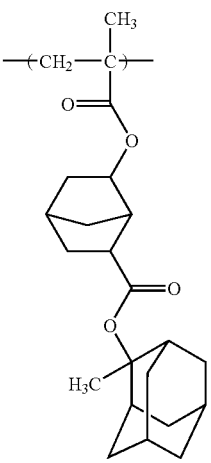
(a1-3-13)
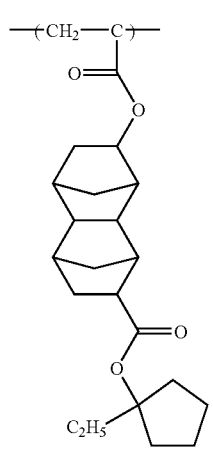
(a1-3-11)
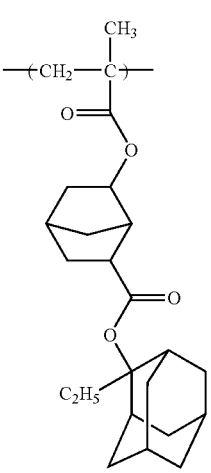
(a1-3-14)
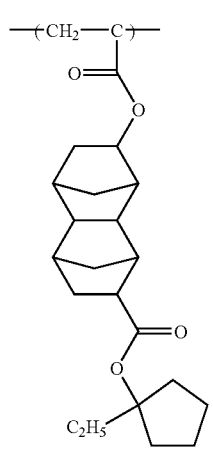
(a1-3-12)
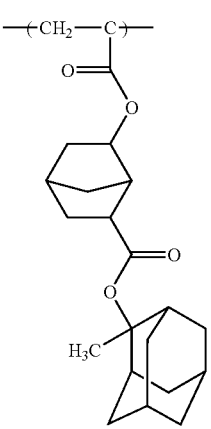
(a1-3-15)

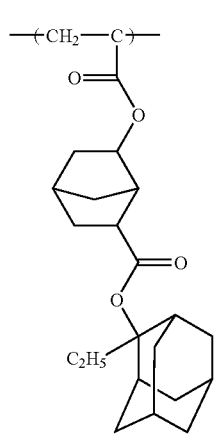
(a1-3-16)
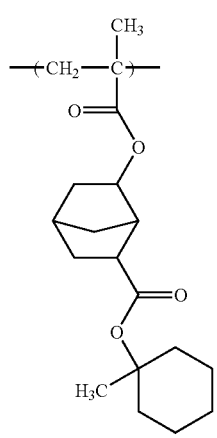
(a1-3-17)
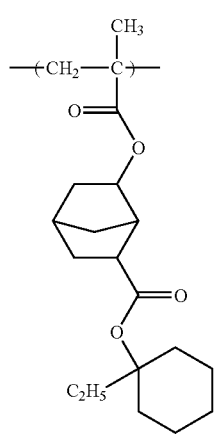
(a1-3-18)
[Chemical Formula 7]
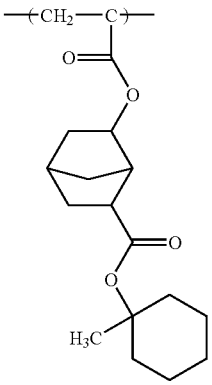
(a1-3-19)
(a1-3-20)
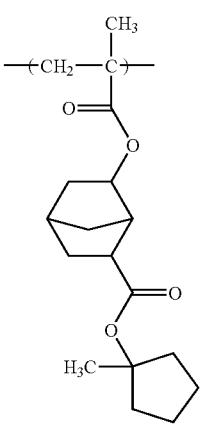
(a1-3-21)

-continued
(a1-3-22)
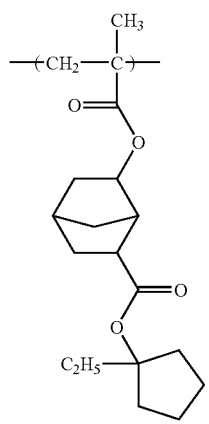
(a1-3-23)
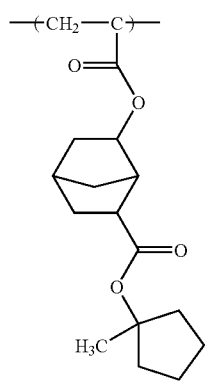
(a1-3-24)
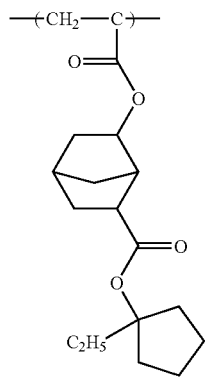
[Chemical Formula 8]
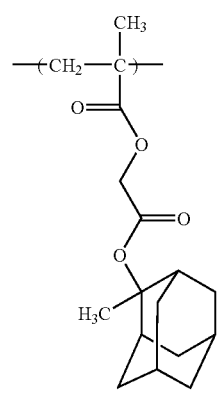
(a1-3-25)
-continued
(a1-3-26)
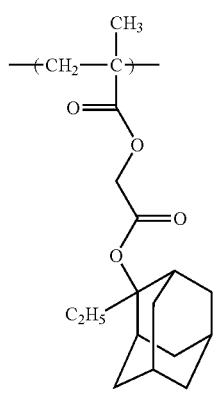
(a1-3-27)
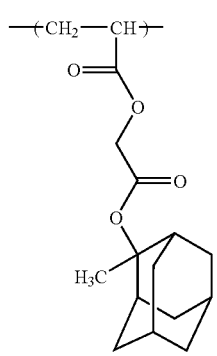
(a1-3-28)
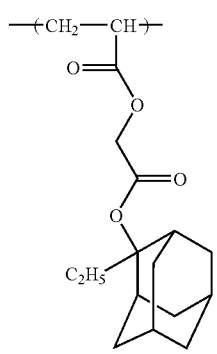
(a1-3-29)
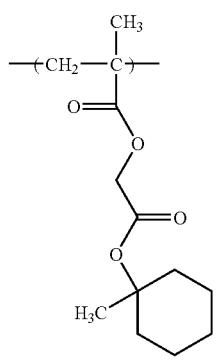

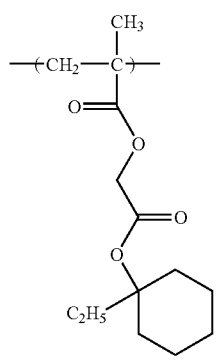 (a1-3-30)
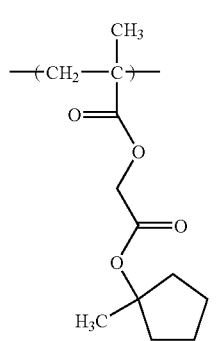 (a1-3-31)
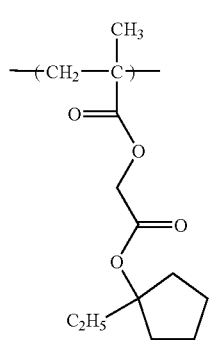 (a1-3-32)
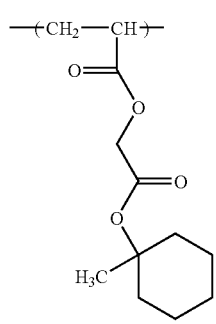 (a1-3-33)
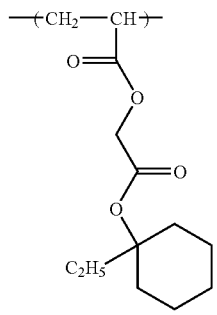 (a1-3-34)
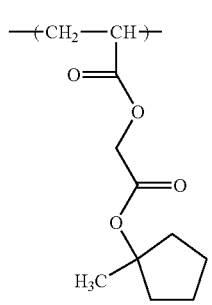 (a1-3-35)
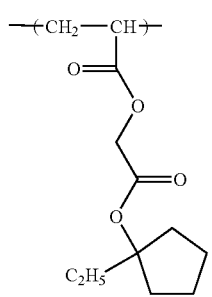 (a1-3-36)
[Chemical Formula 9]
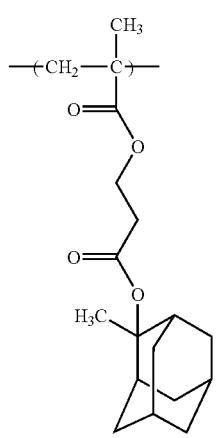 (a1-3-37)

-continued
(a1-3-38)
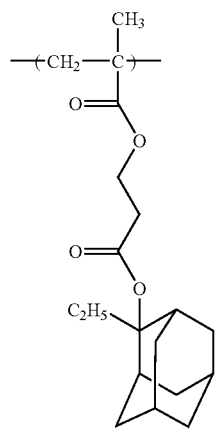
(a1-3-39)
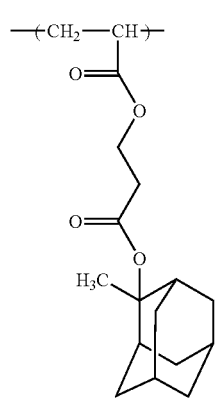
(a1-3-40)
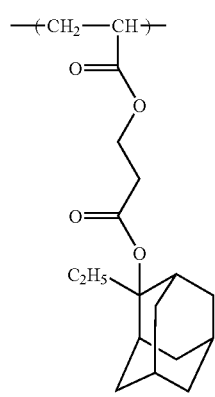
(a1-3-41)
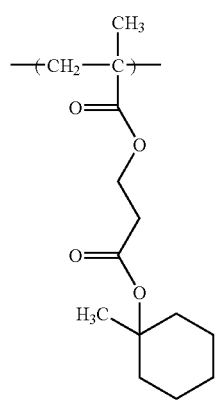
-continued
(a1-3-42)
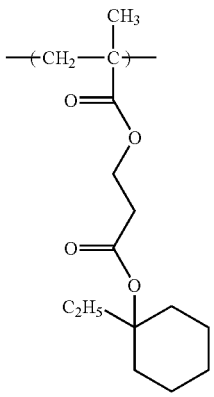
(a1-3-43)
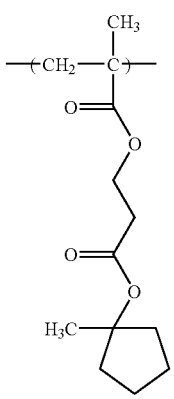
(a1-3-44)
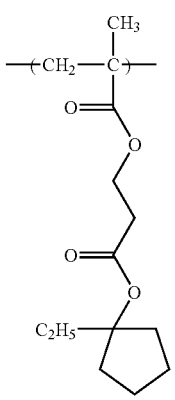
(a1-3-45)
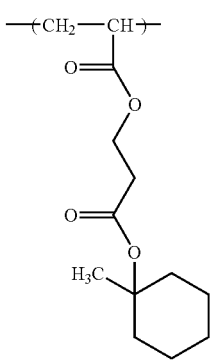

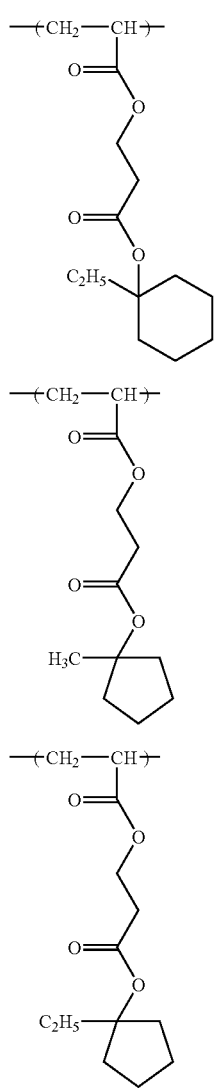

In the component (A), as the structural unit (a1), one type may be used alone, or two or more types may be used in combination. As the structural unit (a1), it is preferable to use at least one selected from the group consisting of structural units represented by formulas (a1-3-1) to (a1-3-48), more preferably at least one selected from the group consisting of structural units represented by formulas (a1-3-25) to (a1-3-48), and most preferably the structural unit represented by formula (a1-3-25).

In the component (A), the amount of the structural unit (a1) based on the combined total of all structural units constituting the component (A) is preferably 10 to 80 mol %, more preferably 20 to 70 mol %, and still more preferably 25 to 50 mol %. By making the amount of the structural unit (a1) at least as large as the lower limit of the above-mentioned range, the effects of including the structural unit (a1) can be satisfactorily achieved. On the other hand, by making the amount of the structural unit (a1) no more than the upper limit of the above-mentioned range, a good balance can be achieved with the other structural units.

—Structural Unit (a'1)

In the present invention, it is preferable that the component (A) further has a structural unit (a'1) derived from an acrylate ester having an acid dissociable, dissolution inhibiting group, which is other than the structural unit (a1).

As the structural unit (a'1), for example, a structural unit represented by general formula (a1-0-1) shown below is preferable.

[Chemical Formula 10]

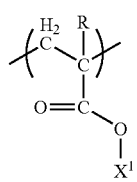

(a1-0-1)

wherein R represents a hydrogen atom, a lower alkyl group or a halogenated lower alkyl group; and $X^1$ represents an acid dissociable, dissolution inhibiting group.

In general formula (a1-0-1) above, R is as defined for R in general formula (a1-0-2) above.

$X^1$ is as defined for $X^2$ in general formula (a1-0-2) above.

Specific examples of the structural unit (a1) include structural units represented by general formulas (a1-1), (a1-2) and (a1-4) shown below.

[Chemical Formula 11]

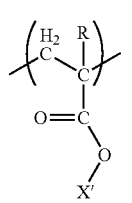

(a1-1)

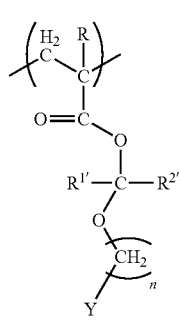

(a1-2)

-continued (a1-4)

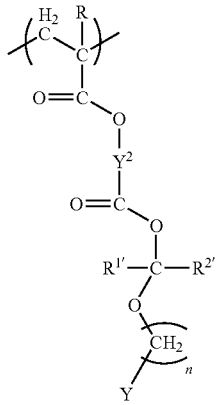

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R is as defined above; and $R^{1'}$ and $R^{2'}$ each independently represents a hydrogen atom or a lower alkyl group of 1 to 5 carbon atoms.

Examples of the tertiary alkyl ester-type acid dissociable, dissolution inhibiting group for X' are the same as the above-exemplified tertiary alkyl ester-type acid dissociable, dissolution inhibiting groups for $X^2$.

$R^{1'}$, $R^{2'}$, n and Y are respectively as defined for $R^{1'}$, $R^{2'}$, n and Y in general formula (p1) exemplified above in connection with the "acetal-type, acid dissociable, dissolution inhibiting group".

$Y^2$ is as defined for $Y^2$ in general formula (a1-0-2).

Specific examples of structural units represented by general formulas (a1-1), (a1-2) and (a1-4) are shown below.

[Chemical Formula 12]

(a1-1-1)

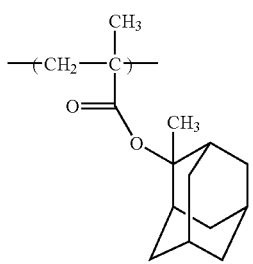

(a1-1-2)

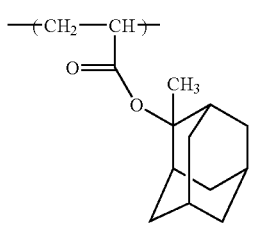

-continued (a1-1-3)

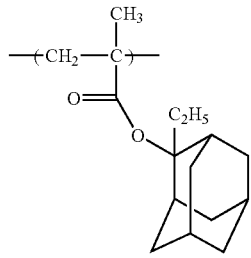

(a1-1-4)

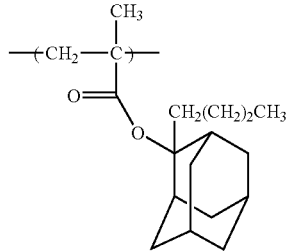

(a1-1-5)

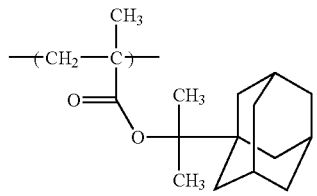

(a1-1-6)

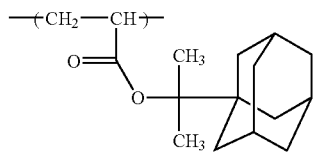

(a1-1-7)

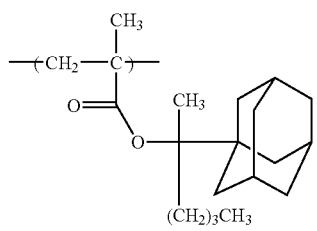

(a1-1-8)

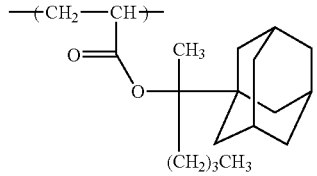

(a1-1-9)

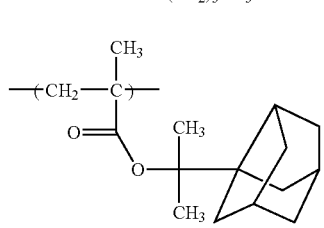

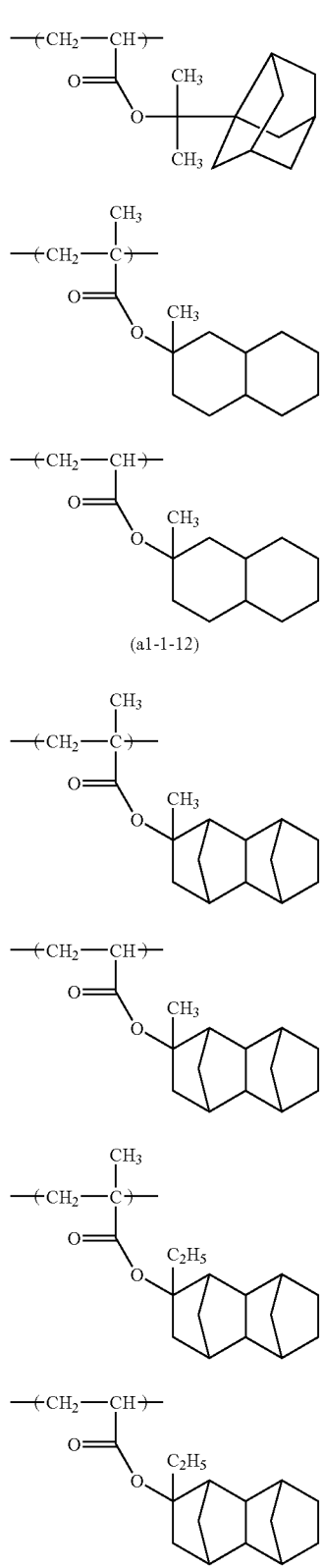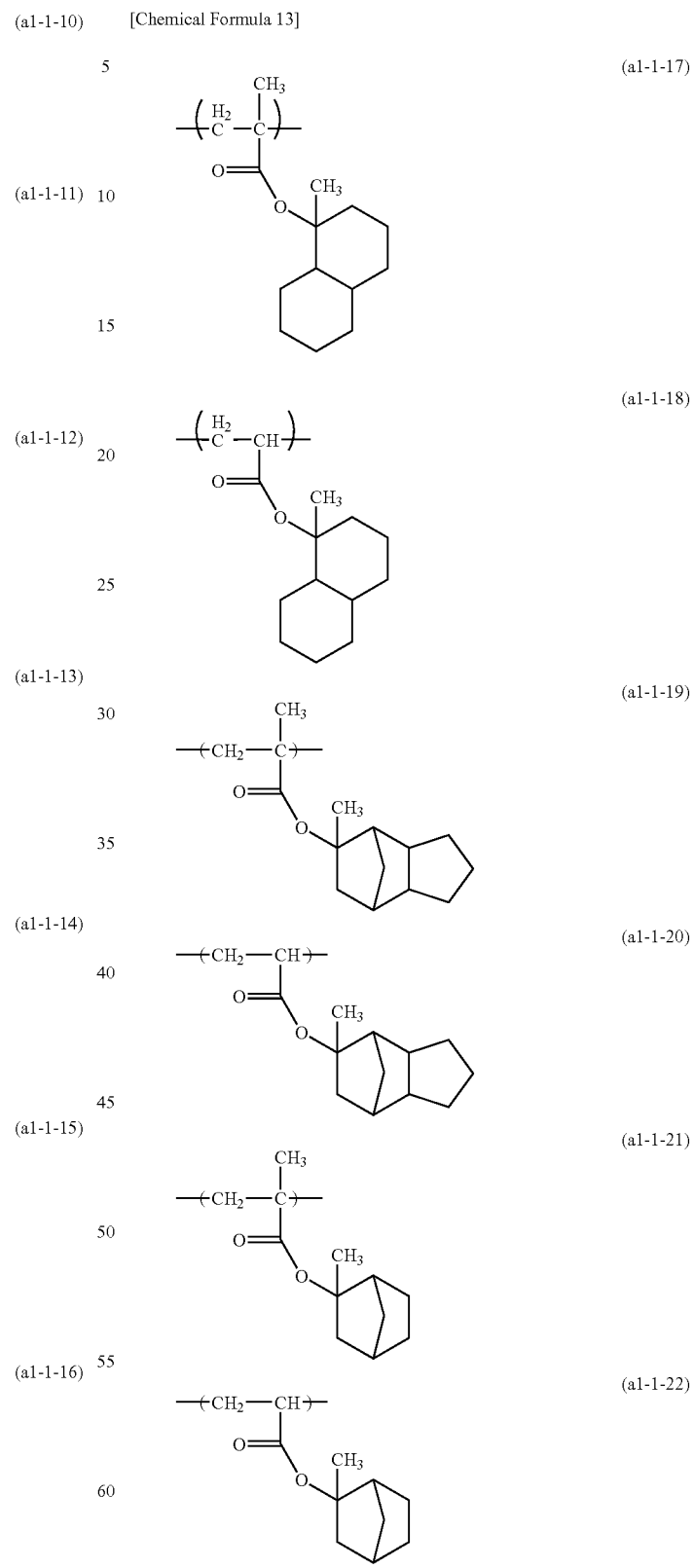

(a1-1-23)
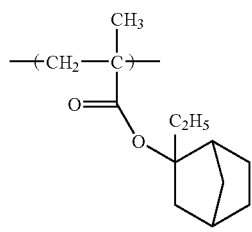
(a1-1-24)
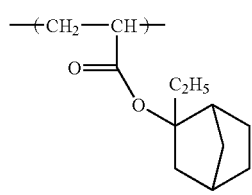
(a1-1-25)
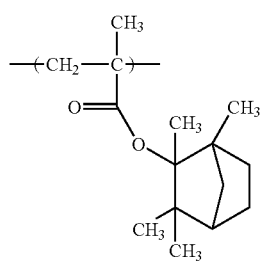
(a1-1-26)
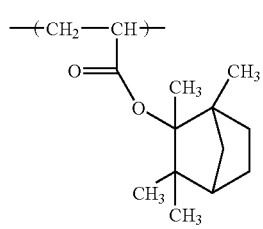
(a1-1-27)
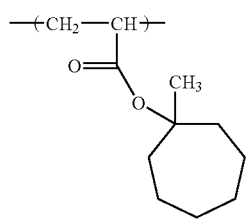
(a1-1-28)
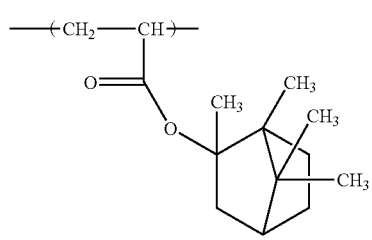
(a1-1-29)
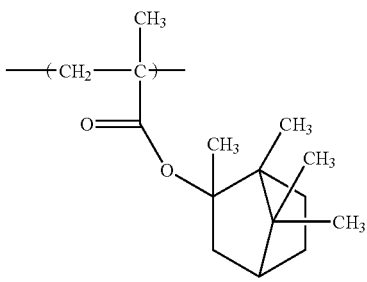
(a1-1-30)
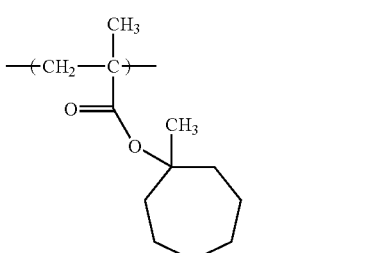
(a1-1-31)
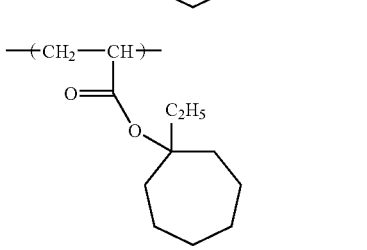
(a1-1-32)
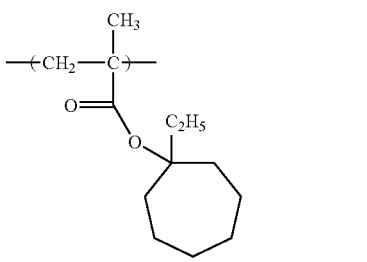
[Chemical Formula 14]
(a1-1-33)
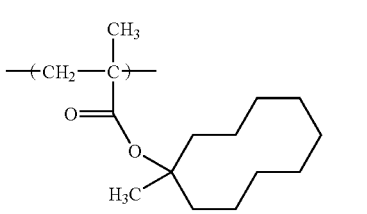
(a1-1-34)
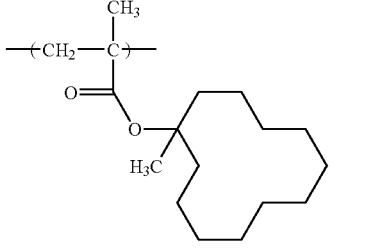

(a1-1-35) 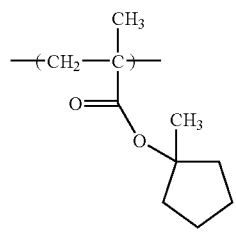
(a1-1-36) 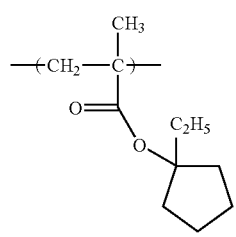
(a1-1-37) 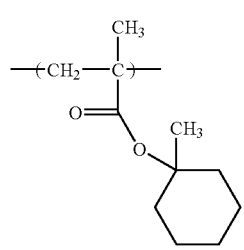
(a1-1-38) 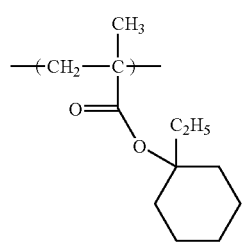
(a1-1-39) 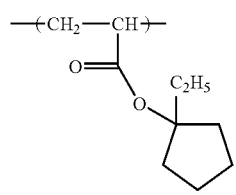
(a1-1-40) 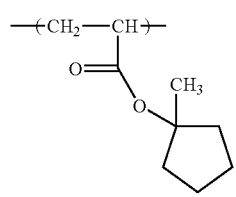
(a1-1-41) 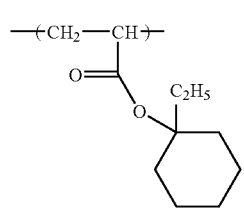
(a1-1-42) 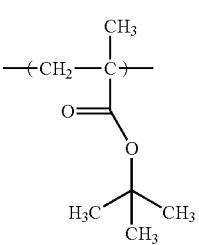
(a1-1-43) 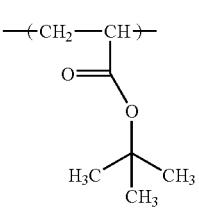
(a1-1-44) 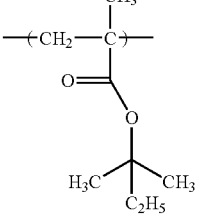
(a1-1-45) 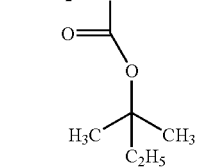
[Chemical Formula 15]
(a1-2-1) 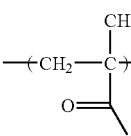
(a1-2-2) 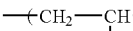
(a1-2-3) 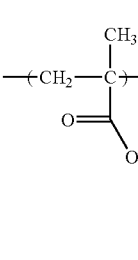

(a1-2-4)
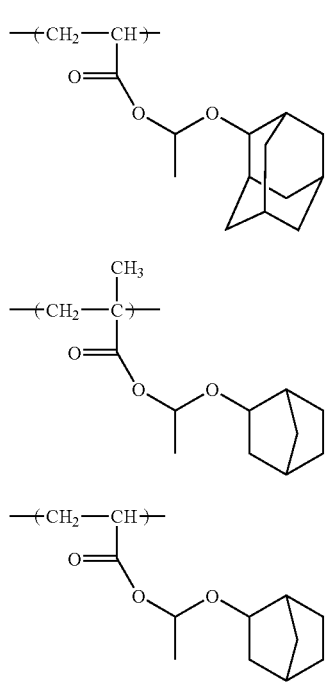
(a1-2-5)
(a1-2-6)
[Chemical Formula 16]
(a1-2-7)
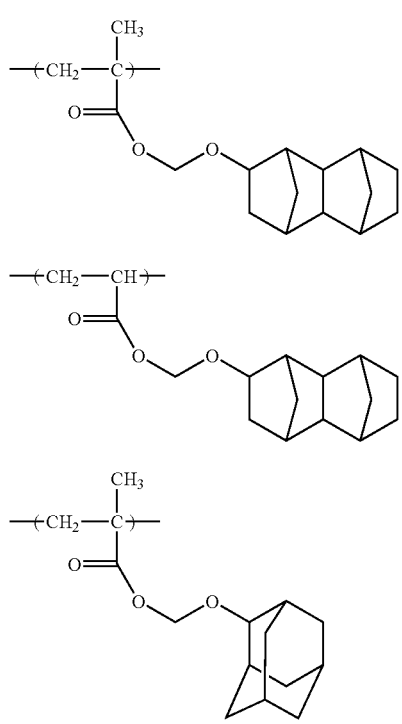
(a1-2-8)
(a1-2-9)
(a1-2-10)
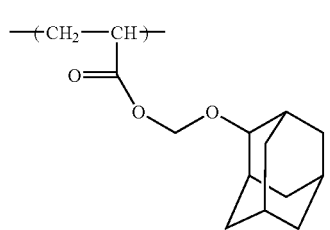
(a1-2-11)
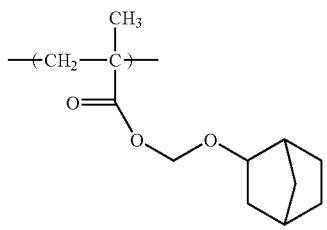
(a1-2-12)
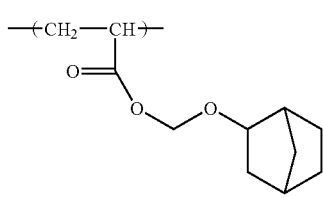
(a1-2-13)
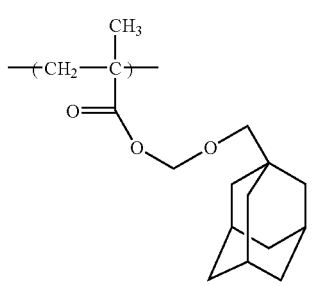
(a1-2-14)
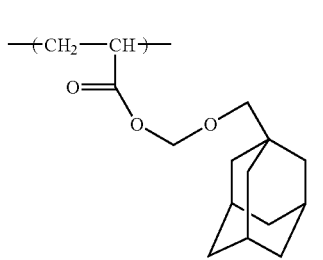
(a1-2-15)
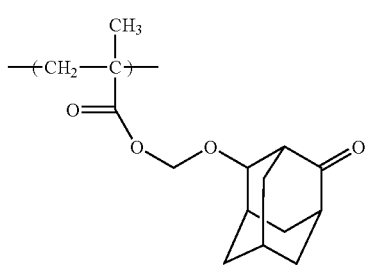
(a1-2-16)
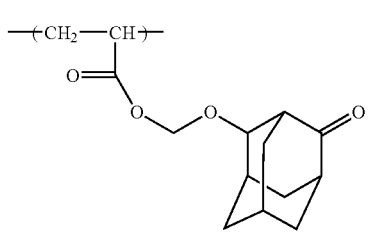

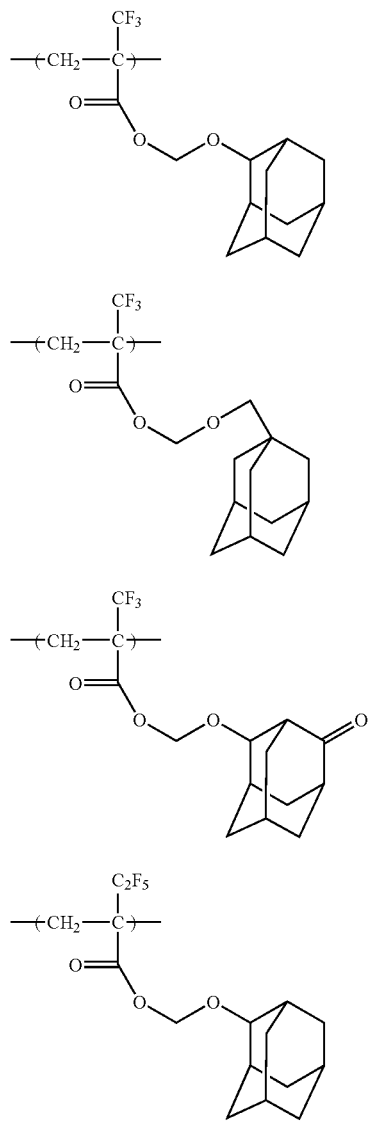
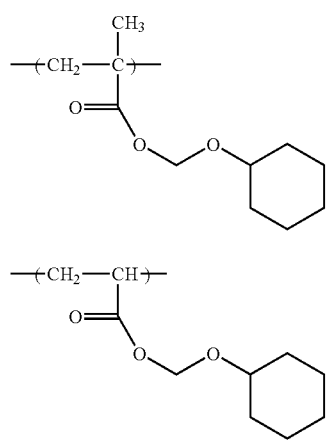
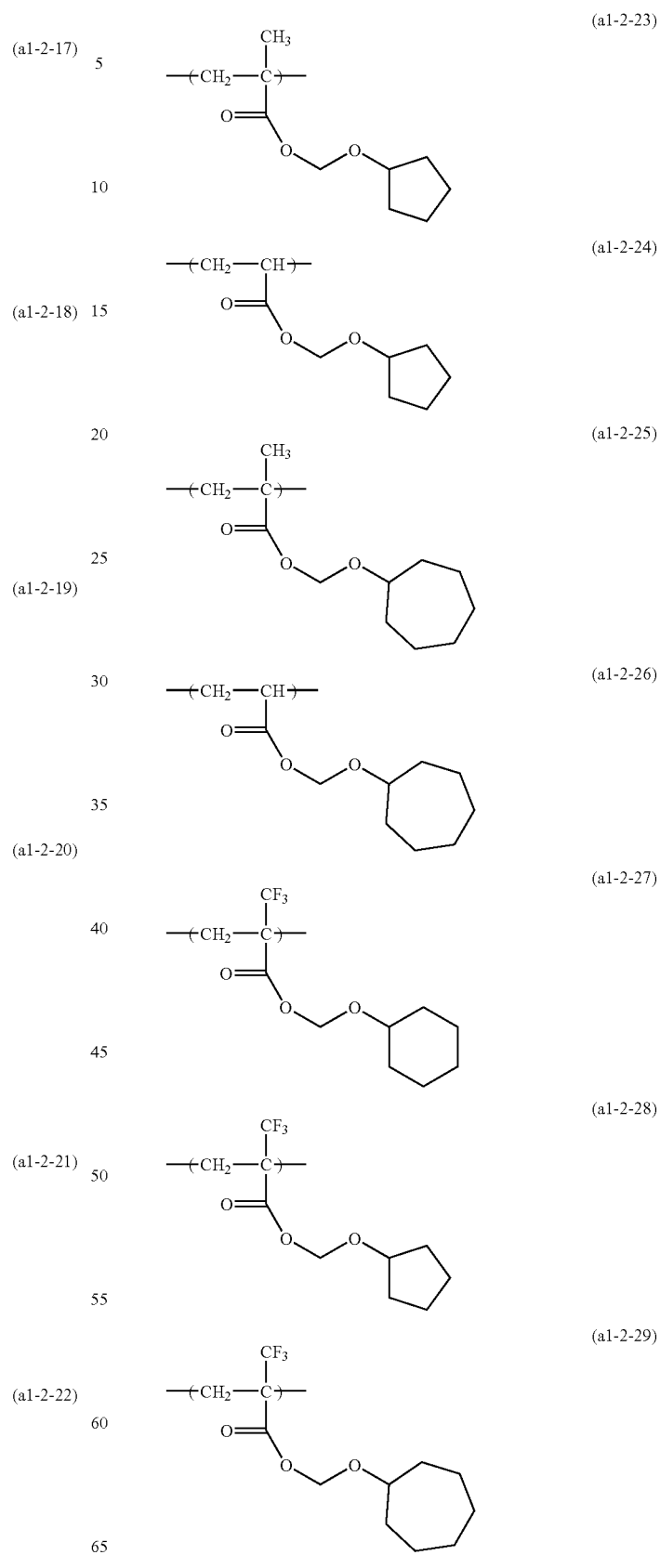

-continued
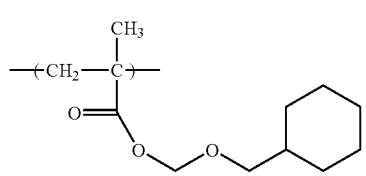 (a1-2-30)
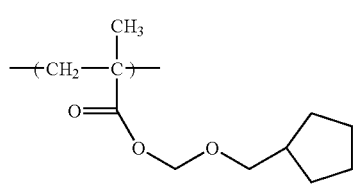 (a1-2-31)
[Chemical Formula 18]
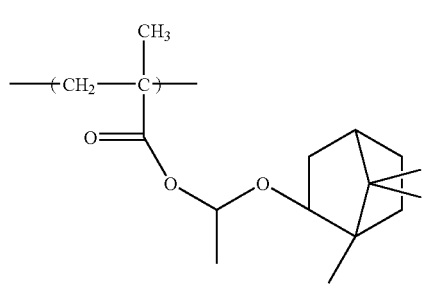 (a1-2-32)
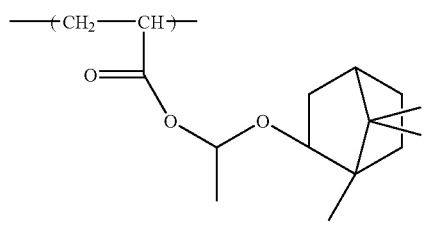 (a1-2-33)
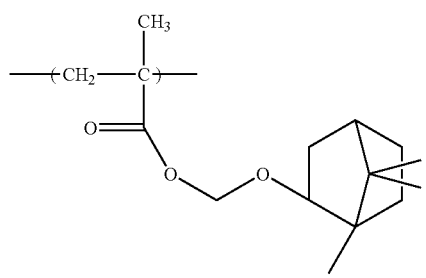 (a1-2-34)
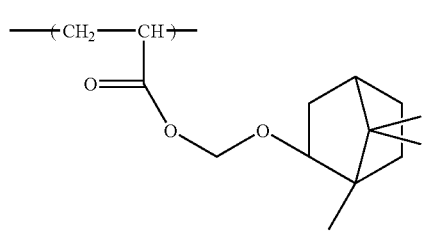 (a1-2-35)
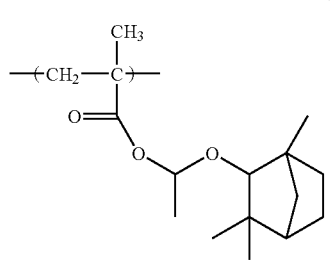 (a1-2-36)
-continued
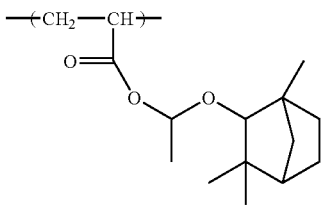 (a1-2-37)
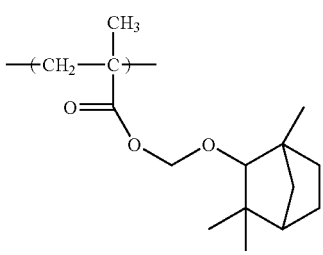 (a1-2-38)
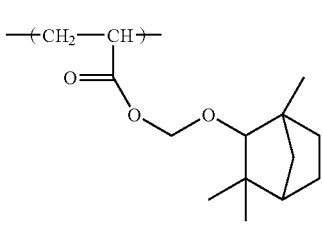 (a1-2-39)
[Chemical Formula 19]
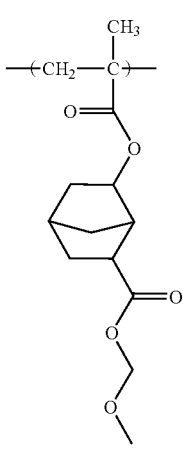 (a1-4-1)
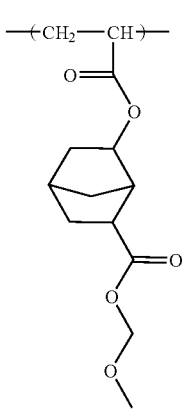 (a1-4-2)

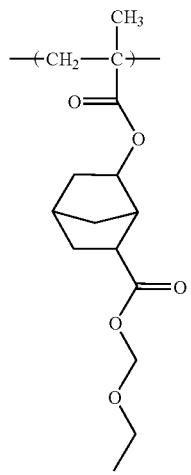
(a1-4-3)
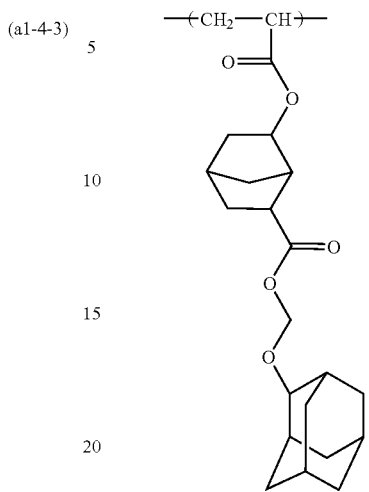
(a1-4-6)
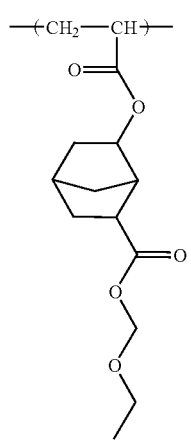
(a1-4-4)
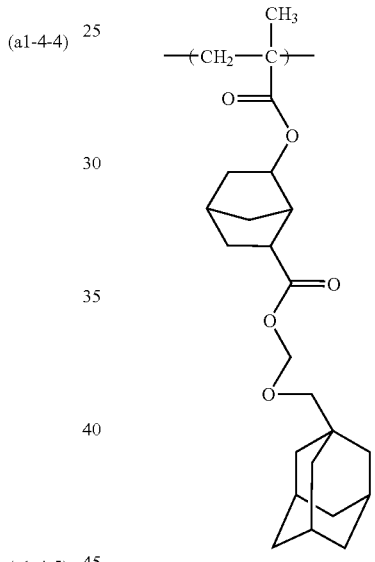
(a1-4-7)
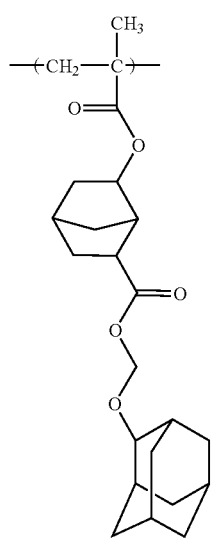
(a1-4-5)
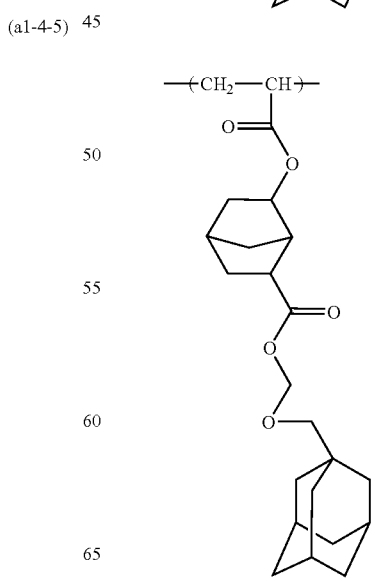
(a1-4-8)

(a1-4-9) 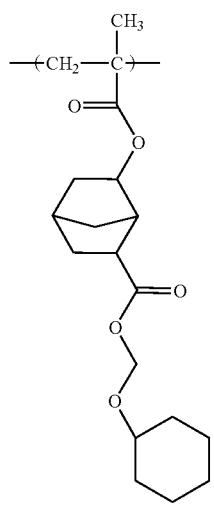
(a1-4-10) 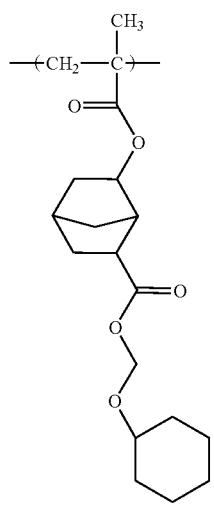
(a1-4-11)
(a1-4-12) 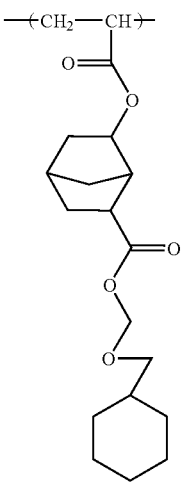
(a1-4-13) 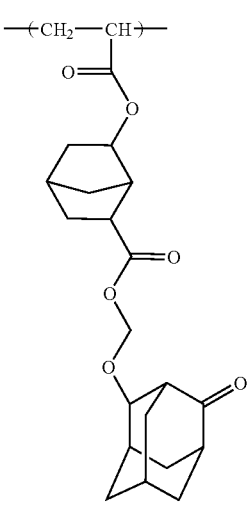
(a1-4-14) 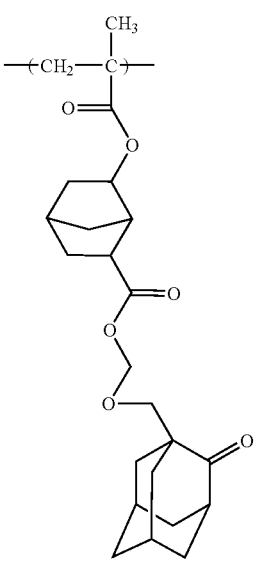

-continued
(a1-4-15)
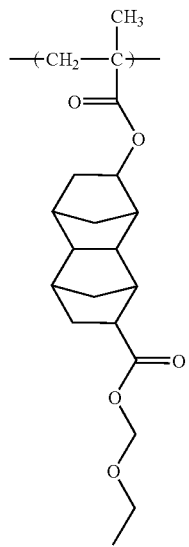
(a1-4-16)
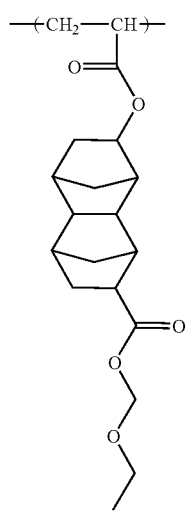
(a1-4-17)
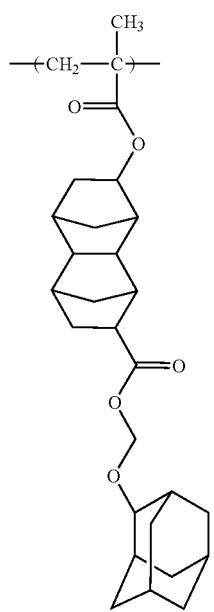
-continued
[Chemical Formula 20]
(a1-4-18)
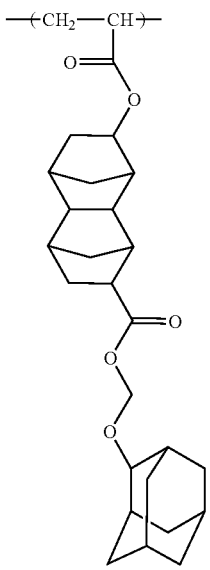
(a1-4-19)
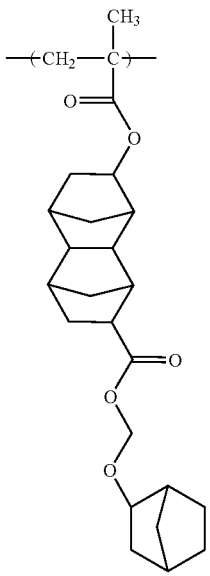

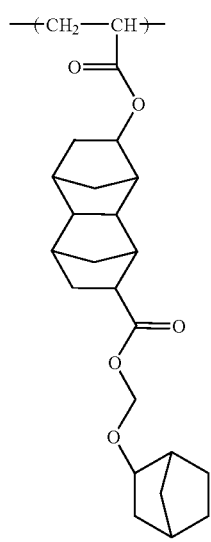
(a1-4-20)
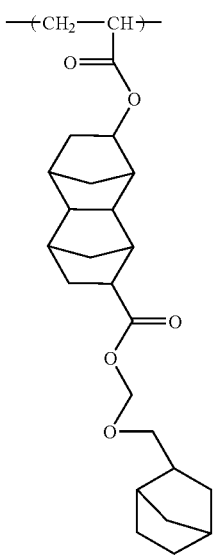
(a1-4-22)
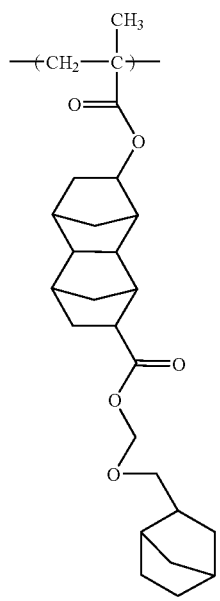
(a1-4-21)
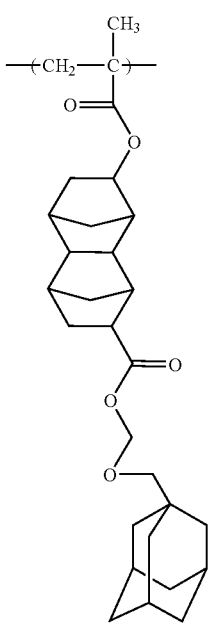
(a1-4-23)

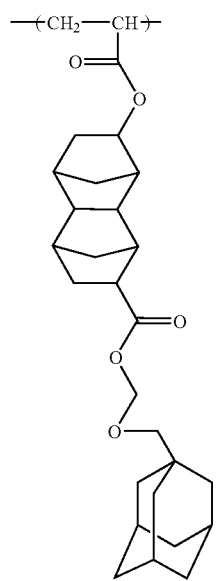 (a1-4-24)
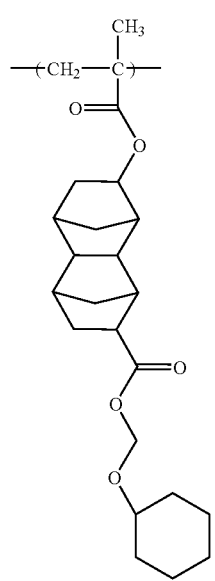 (a1-4-25)
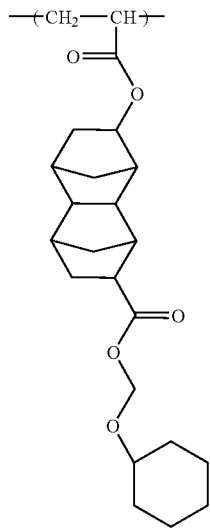 (a1-4-26)
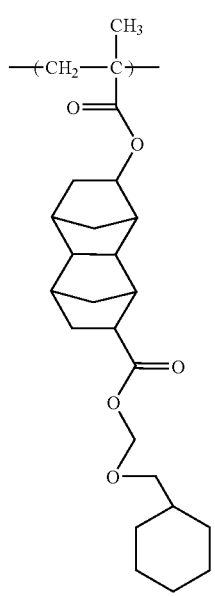 (a1-4-27)
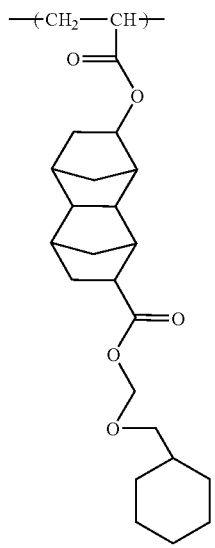 (a1-4-28)

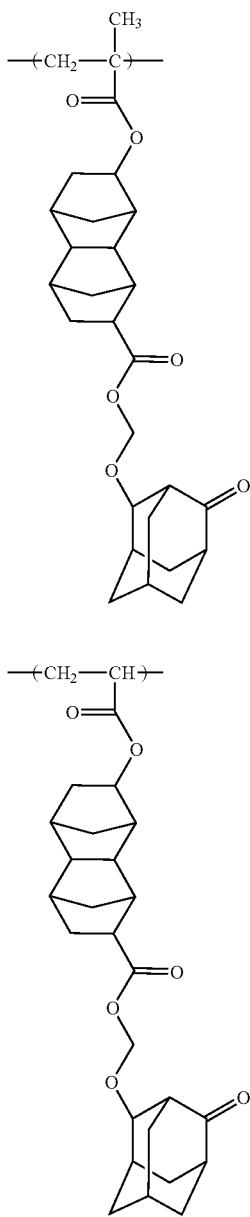

As the structural unit (a'1), one type may be used alone, or two or more types may be used in combination.

Among these, structural units represented by general formula (a1-1) are preferable. More specifically, at least one structural unit selected from the group consisting of structural units represented by formulas (a1-1-1) to (a-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 21]

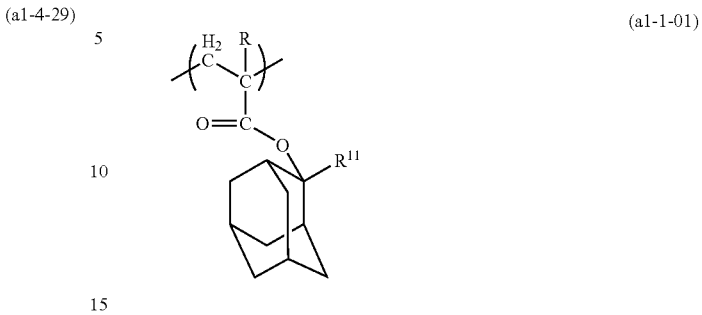

wherein R represents a hydrogen atom, a lower alkyl group or a halogenated lower alkyl group; and $R^{11}$ represents a lower alkyl group.

[Chemical Formula 22]

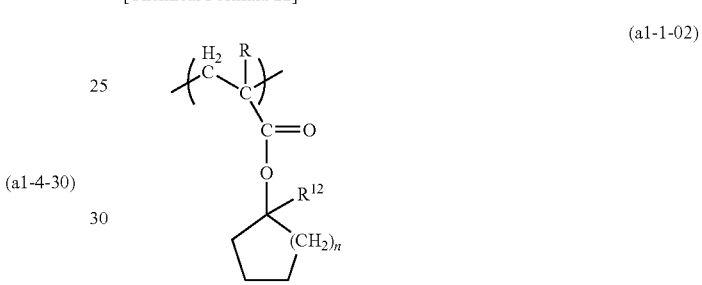

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined above. The lower alkyl group for $R^{11}$ is the same as the lower alkyl group for R above, and is preferably a methyl group or an ethyl group.

In general formula (a1-1-02), R is as defined above. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

When the structural unit (a'1) is included in the component (A), the amount of the structural unit (a'1) based on the combined total of all structural units constituting the component (A) is preferably 10 to 80 mol %, more preferably 20 to 70 mol %, and still more preferably 25 to 50 mol %. By making the amount of the structural unit (a'1) at least as large as the lower limit of the above-mentioned range, a pattern can be easily formed using a resist composition prepared from the component (A). On the other hand, by making the amount of the structural unit (a'1) no more than the upper limit of the above-mentioned range, a good balance can be achieved with the other structural units.

—Structural Unit (a2)

In the present invention, it is preferable that the component (A) further has a structural unit (a2) derived from an acrylate ester having a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the affinity for the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 23]

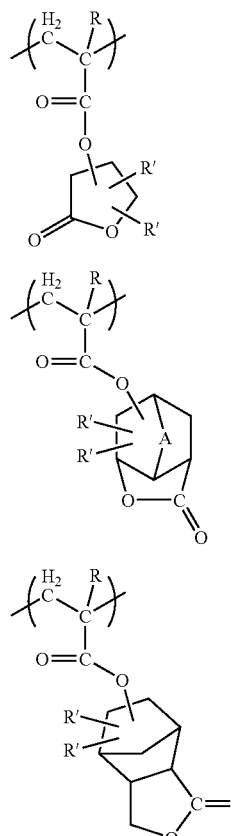

(a2-1)

(a2-2)

(a2-3)

(a2-4)

-continued

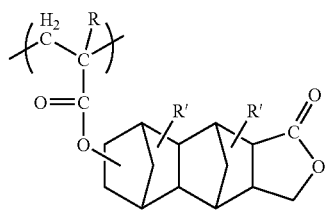

(a2-5)

wherein R represents a hydrogen atom, a lower alkyl group or a halogenated lower all group; R' represents a hydrogen atom, a lower alkyl group or an alkoxy group of 1 to 5 carbon atoms; m represents 0 or 1; and A represents an alkylene group of 1 to 5 carbon atoms or an oxygen atom.

In general formulas (a2-1) to (a2-5), R is the same as R in the structural unit (a1).

The lower alkyl group for R' is the same as the lower alkyl group for R in the structural unit (a1).

Specific examples of alkylene groups of 1 to 5 carbon atoms for A include a methylene group, ethylene group, n-propylene group and isopropylene group.

In the structural units represented by general formulas (a2-1) to (a2-5), in consideration of industrial availability, R' is preferably a hydrogen atom.

Specific examples of structural units represented by general formulas (a2-1) to (2-5) above are shown below.

[Chemical Formula 24]

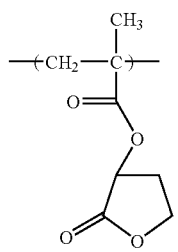

(a2-1-1)

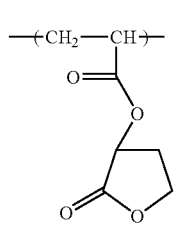

(a2-1-2)

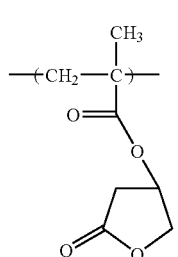

(a2-1-3)

-continued
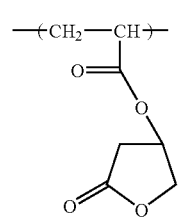 (a2-1-4)
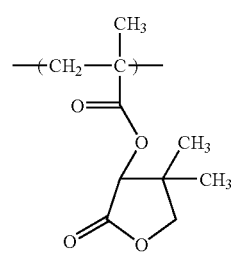 (a2-1-5)
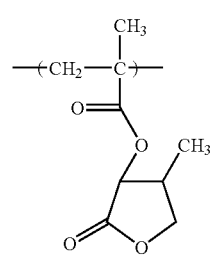 (a2-1-6)
[Chemical Formula 25]
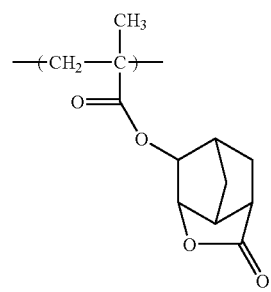 (a2-2-1)
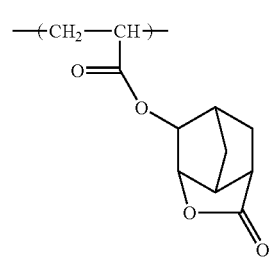 (a2-2-2)
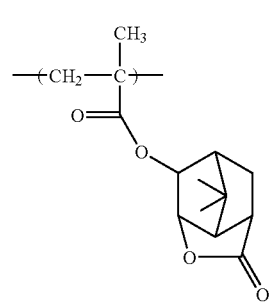 (a2-2-3)
-continued
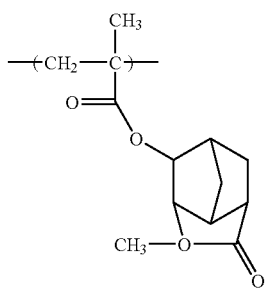 (a2-2-4)
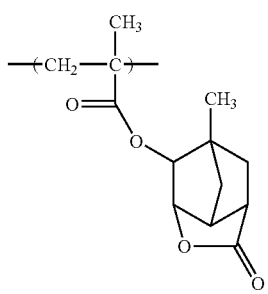 (a2-2-5)
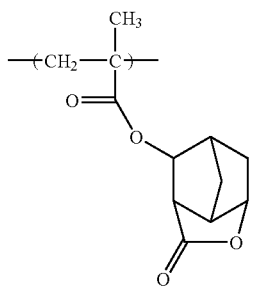 (a2-2-6)
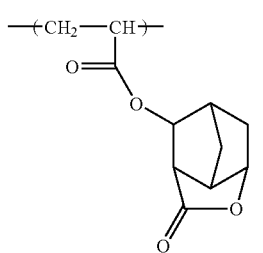 (a2-2-7)
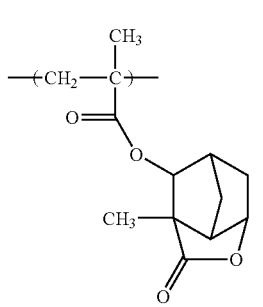 (a2-2-8)

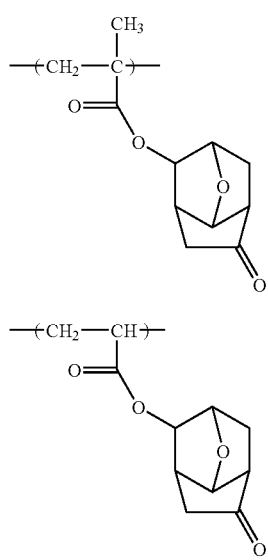
(a2-2-9)
(a2-2-10)
[Chemical Formula 26]
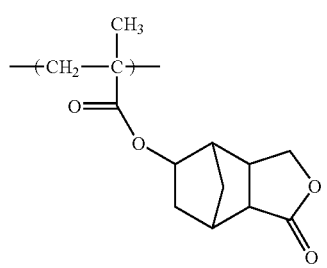
(a2-3-1)
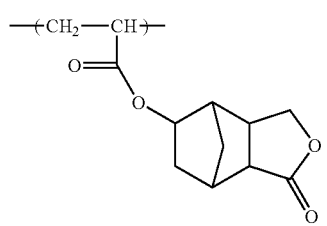
(a2-3-2)
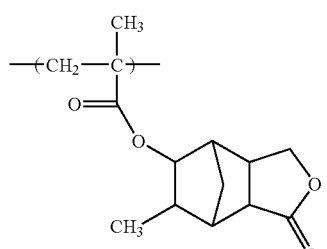
(a2-3-3)
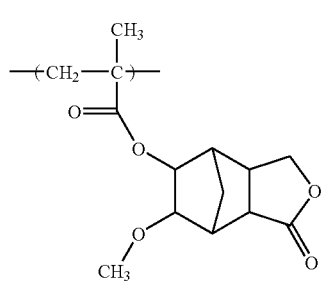
(a2-3-4)
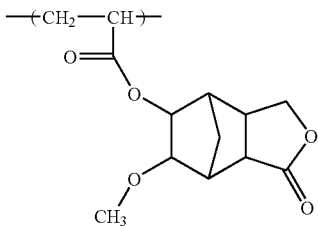
(a2-3-5)
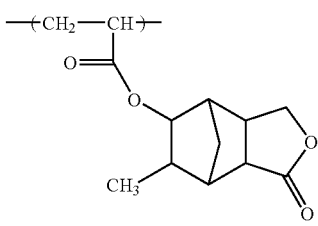
(a2-3-6)
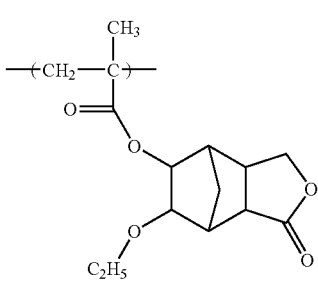
(a2-3-7)
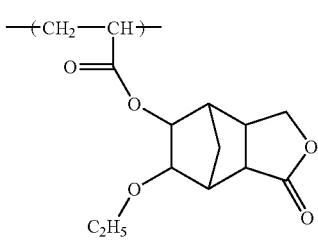
(a2-3-8)
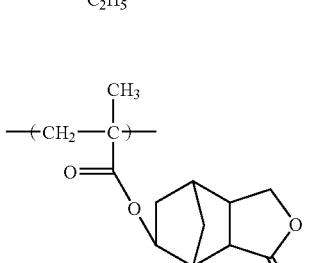
(a2-3-9)
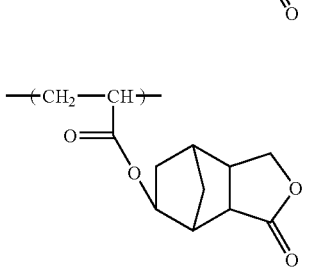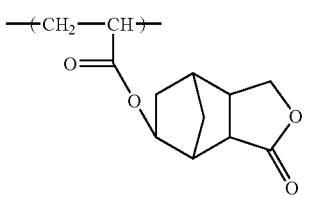
(a2-3-10)

[Chemical Formula 27]
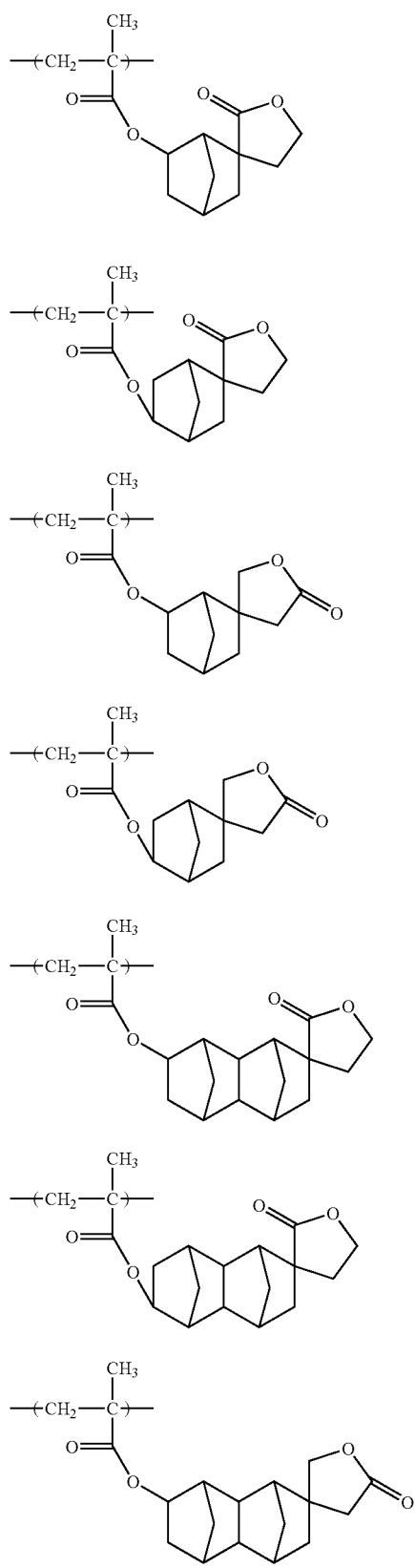
(a2-4-1)
(a2-4-2)
(a2-4-3)
(a2-4-4)
(a2-4-5)
(a2-4-6)
(a2-4-7)
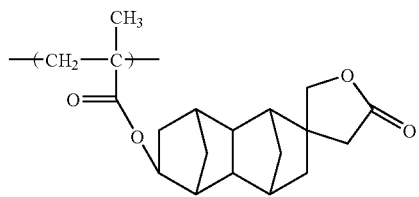
(a2-4-8)
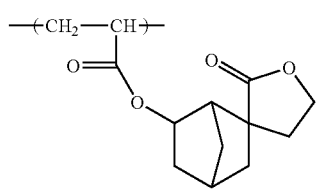
(a2-4-9)
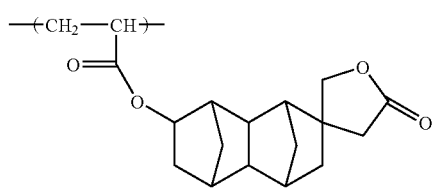
(a2-4-10)
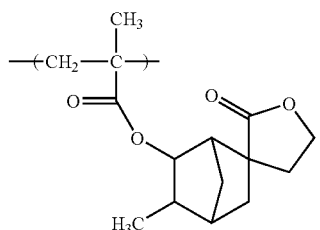
(a2-4-11)
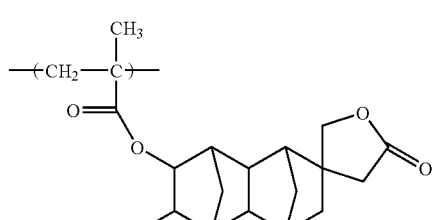
(a2-4-12)
[Chemical Formula 28]
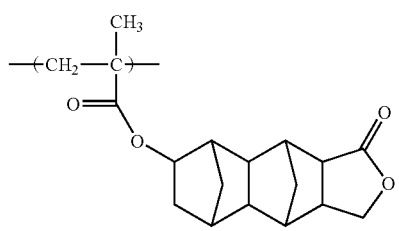
(a2-5-1)
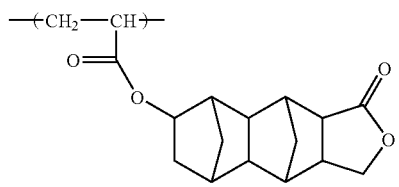
(a2-5-2)

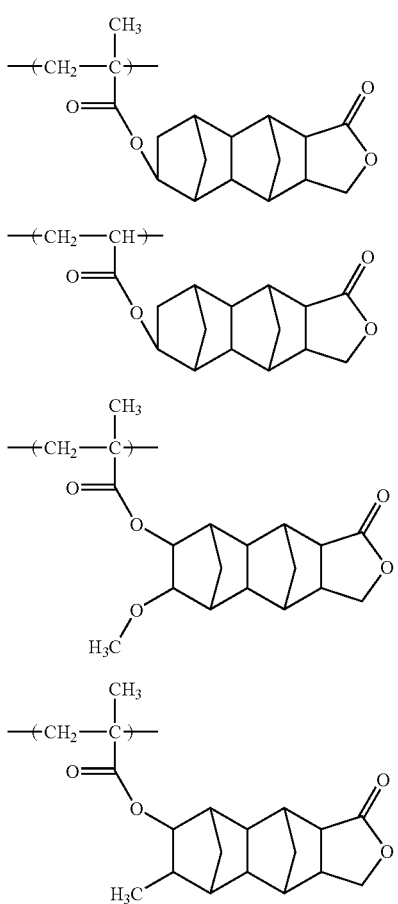

(a2-5-3)

(a2-5-4)

(a2-5-5)

(a2-5-6)

In the component (A), as the structural unit (a2), one type of structural unit may be used, or two or more types may be used in combination.

Of these, at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A), the amount of the structural unit (a2) based on the combined total of all structural units constituting the component (A) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

—Structural Unit (a3)

It is preferable that the component (A) further has a structural unit (a3) derived from an acrylate ester having a polar group-containing aliphatic hydrocarbon group. When the component (A) includes the structural unit (a3), the hydrophilicity of the component (A) is improved, and hence, the affinity of the component (A) for the developing solution is improved. As a result, the solubility of the exposed portions in an alkali developing solution improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 29]

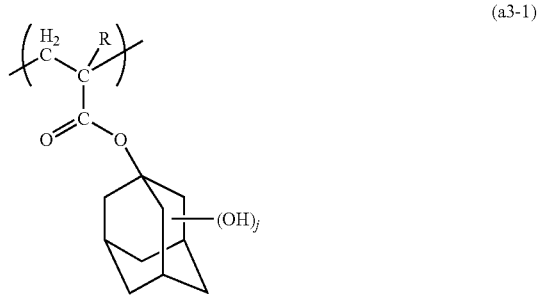

(a3-1)

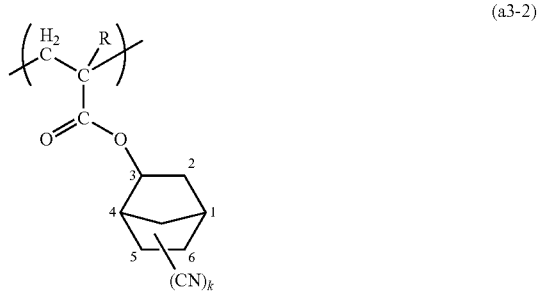

(a3-2)

-continued (a3-3)

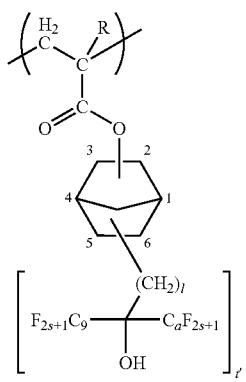

wherein R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3-rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

In the component (A), as the structural unit (a3), one type of structural unit may be used, or two or more types may be used in combination.

When the component (A) contains the structural unit (a3), the amount of structural unit (a3) based on the combined total of all structural units constituting the component (A) is preferably 5 to 50 mol % A more preferably 5 to 40 mol %, and still more preferably 5 to 25 mol %.

—Structural Unit (a4)

The component (A) may also have a structural unit (a4) which is other than the above-mentioned structural units (a'1) and (a1) to (a3), as long as the effects of the present invention are not impaired.

As the structural unit (a4), any other structural unit which cannot be classified as one of the above structural units (a'1) and (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable, These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 30]

(a4-1)

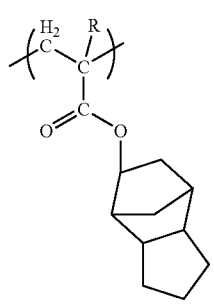

(a4-2)

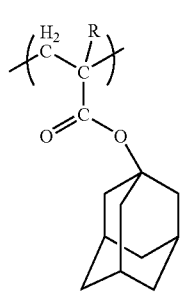

(a4-3)

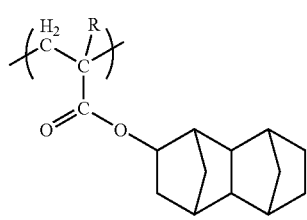

(a4-4)

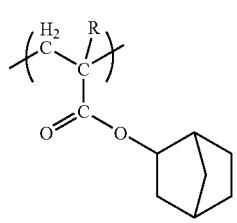

(a4-5)

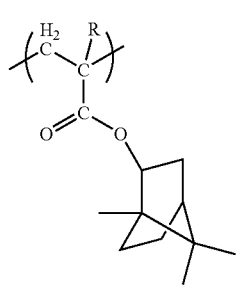

wherein R is as defined above.

When the structural unit (a4) is included in the component (A), the amount of the structural unit (a4) based on the combined total of all the structural units that constitute the component (A1) is preferably within the range from 1 to 30 mol %, and more preferably from 10 to 20 mol %.

In the present invention, the component (A) is preferably a copolymer (A1) including the structural unit (a'1). As an example of such a copolymer (A1), a copolymer including the structural units (a'1), (a2) and (a3) may be exemplified.

In the component (A), as the copolymer (A1), one type may be used, or two or more types may be used in combination.

In the present invention, as the copolymer (A1), it is particularly desirable to use a combination of structural units shown below.

[Chemical Formula 31]

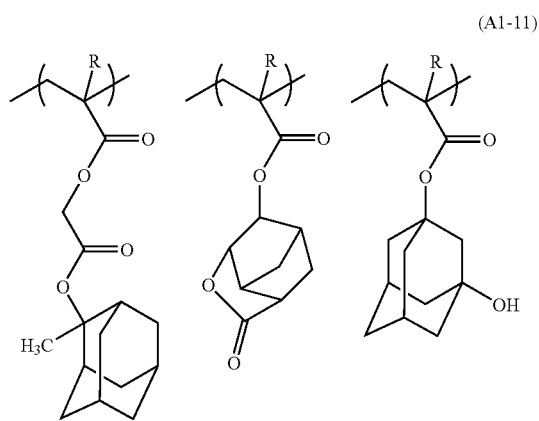

(A1-11)

wherein R is as defined above.

The copolymer (A1) can be obtained, for example, by a conventional radical polymerization or the like of the monomers corresponding with each of the structural units, using a radical polymerization initiator such as azobisisobutyronitrile (AIBN).

Furthermore, in the copolymer (A1), by using a chain transfer agent such as HS—$CH_2$—$CH_2$—$CH_2$—$C(CF_3)_2$—OH, a —$C(CF_2)_2$—OH group can be introduced at the terminals of the copolymer (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the copolymer (A1) is not particularly limited, but is preferably 2,000 to 50,000, more preferably 3,000 to 30,000, and most preferably 5,000 to 20,000. By making the weight average molecular weight no more than the upper limit of the above-mentioned range, the copolymer (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

<Component (B)>

In the positive resist composition of the present invention, the component (B) includes an acid generator (B1) (hereafter referred to as "component (B1)") consisting of a compound represented by general formula (b1-12) above.

By virtue of the component (B) including the component (B1), an excellent resist pattern can be formed using the positive resist composition of the present invention.

<Component (B1)>

The component (B1) is an acid generator consisting of a compound represented by general formula (b1-12) above. In general formula (b1-12), $R^2$ represents a monovalent aromatic organic group; $Y^1$ represents an alkylene group of 1 to 4 carbon atoms which may be substituted with a fluorine atom; and $A^+$ represents a cation.

Examples of monovalent aromatic organic groups for $R^2$ include aryl groups in which one hydrogen atom has been removed from an aromatic hydrocarbon ring, such as a phenyl group, a biphenyl group, a fluorenyl group, a naphthyl group, an anthryl group, and a phenantryl group; heteroaryl groups in which some of the carbon atoms constituting the ring(s) of these groups are substituted with hetero atoms such as an oxygen atom, a sulfur atom, and a nitrogen atom; and arylalkyl groups such as a benzyl group and phenethyl group. The alkyl chain within the arylalkyl group preferably has 1 to 4 carbon atom, more preferably 1 to 3, and most preferably 1 or 2. These aryl groups, heteroaryl groups and arylalkyl groups may have a substituent such as an alkyl group of 1 to 10 carbon atoms, a halogenated alkyl group, an alkoxy group, a hydroxyl group or a halogen atom. The alkyl group or halogenated alkyl group as the substituent preferably has 1 to 8 carbon atoms, and more preferably 1 to 4 carbon atoms. The halogenated alkyl group is preferably a fluorinated alkyl group. Examples of halogen atoms include a fluorine atom, a chlorine atom, a bromine atom and an iodine atom and a fluorine atom is preferable.

The monovalent aromatic organic group for $R^2$ preferably has 6 to 20 carbon atoms, more preferably 6 to 10, and most preferably 10.

As the monovalent aromatic organic group for $R^2$, an arylalkyl group such as a benzyl group or a phenethyl group is preferable, and a benzyl group is particularly desirable.

Examples of alkylene groups of 1 to 4 carbon atoms for $Y^1$ which may be fluorinated include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

As the alkylene group of 1 to 4 carbon atoms for $Y^1$ which may be fluorinated, it is preferable that the carbon atom bonded to S be fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Among these, —CF$_2$CF$_2$—, —CF$_2$CF$_2$CF$_2$—, and —CH$_2$CF$_2$CF$_2$— are preferable, —CF$_2$CF$_2$— and —CF$_2$CF$_2$CF$_2$— are more preferable, and —CF$_2$CF$_2$— is particularly desirable.

The cation for A$^+$ is not particularly limited, and any of those known as cations for an onium salt-based acid generator may be appropriately used. More specifically, a cation moiety represented by general formula (b-1) (b-2), (b-5) or (b-6) shown below may be preferably used.

[Chemical Formula 32]

wherein R$^{1''}$ to R$^{3''}$, R$^{5''}$ and R$^{6''}$ each independently represents an aryl group or alkyl group, wherein two of R$^{1''}$ to R$^{3''}$ in formula (b-1) may be bonded to each other to form a ring with the sulfur atom, with the proviso that at least one of R$^{1''}$ to R$^{3''}$ represents an aryl group, and at least one of R$^{5''}$ and R$^{6''}$ represents an aryl group.

[Chemical Formula 33]

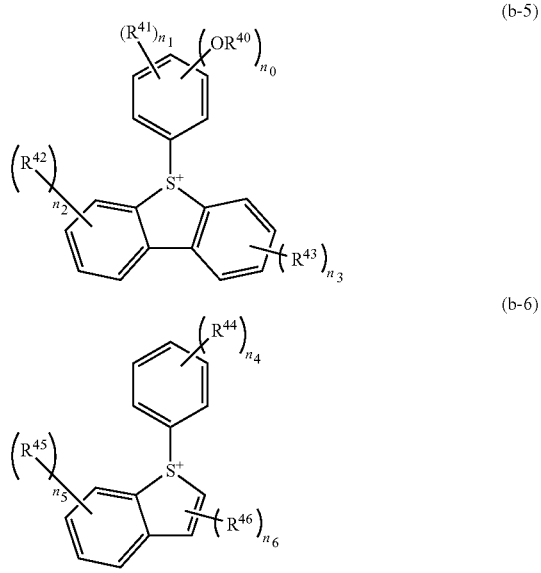

wherein R$^{40}$ represents a hydrogen atom or an alkyl group; R$^{41}$ represents an alkyl group, an acetyl group, a carboxy group or a hydroxyalkyl group; R$^{42}$ to R$^{46}$ each independently represents an alkyl group, an acetyl group, an alkoxy group, a carboxy group or a hydroxyalkyl group, n$_0$ to n$_5$ each independently represents an integer of 0 to 3, with the proviso that n$_0$+n$_1$ is 5 or less, and n$_6$ represents an integer of 0 to 2.

In formula (b-1), R$^{1''}$ to R$^{3''}$ each independently represents an aryl group or an alkyl group. In formula (b-1), two of R$^{1''}$ to R$^{3''}$ in formula (b-1) may be bonded to each other to form a ring with the sulfur atom.

Further, among R$^{1''}$ to R$^{3''}$, at least one group represents an aryl group. Among R$^{1''}$ to R$^{3''}$, two or more groups are preferably aryl groups, and it is particularly desirable that all of R$^{1''}$ to R$^{3''}$ are aryl groups.

The aryl group for R$^{1''}$ to R$^{3''}$ is not particularly limited. For example, a aryl group having 6 to 20 carbon atoms may be used in which some or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for R$^{1''}$ to R$^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of R$^{1''}$ to R$^{3''}$ is a substituted or unsubstituted phenyl group or naphthyl group.

When two of R$^{1''}$ to R$^{3''}$ in formula (b-1) are bonded to each other to form a ring with the sulfur atom, it is preferable that the two of R$^{1''}$ to R$^{3''}$ form a 3 to 10-membered ring including the sulfur atom, and it is particularly desirable that the two of R$^{1''}$ to R$^{3''}$ form a 5 to 7-membered ring including the sulfur atom.

When two of R$^{1''}$ to R$^{3''}$ in formula (b-1) are bonded to each other to form a ring with the sulfur atom, the remaining one of R$^{1''}$ to R$^{3''}$ is preferably an aryl group. As examples of the aryl group, the same as the above-mentioned aryl groups for R$^{1''}$ to R$^{3''}$ can be exemplified.

In formula (b-2), R$^{5''}$ and R$^{6''}$ each independently represents an aryl group or alkyl group. At least one of R$^{5''}$ and R$^{6''}$ represents an aryl group. It is preferable that both of R$^{5''}$ and R$^{6''}$ represent an aryl group.

As the aryl group for R$^{5''}$ and R$^{6''}$, the same as the aryl groups for R$^{1''}$ to R$^{3''}$ can be exemplified.

As the alkyl group for R$^{5''}$ and R$^{6''}$, the same as the alkyl groups for R$^{1''}$ to R$^{3''}$ can be exemplified.

It is particularly desirable that both of R$^{5''}$ and R$^{6''}$ represents a phenyl group.

With respect to R$^{40}$ to R$^{46}$ in general formulas (b-5) and (b-6), the alkyl group is preferably an alkyl group of 1 to 5 carbon atoms, more preferably a linear or branched alkyl group, and most preferably a methyl group, a methyl group, an ethyl group, a propyl group, an isopropyl group, an n-butyl group or a tert-butyl.

The alkoxy group is preferably an alkoxy group of 1 to 5 carbon atoms, more preferably a linear or branched alkoxy group, and most preferably a methoxy group or an ethoxy group.

The hydroxyalkyl group is preferably a group in which one or a plurality of the hydrogen atoms within the aforementioned alkyl group is substituted with a hydroxy group, and examples thereof include a hydroxymethyl group, a hydroxyethyl group and a hydroxypropyl group.

$n_0$ is preferably 0 or 1, and more preferably 0.

$n_1$ is preferably 0 to 2, more preferably 0 or 1, and still more preferably 0.

It is preferable that $n_2$ and $n_3$ each independently represents 0 or 1, more preferably 0.

$n_4$ is preferably 0 to 2, more preferably 0 or 1.

$n_5$ is preferably 0 or 1, and more preferably 0.

$n_6$ is preferably 0 or 1

Specific examples of compounds represented by general formula (b1-12) are shown below.

[Chemical Formula 34]

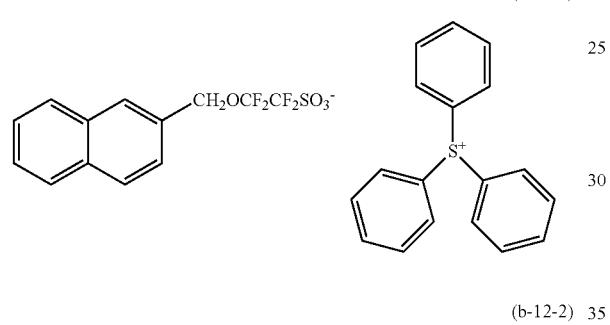

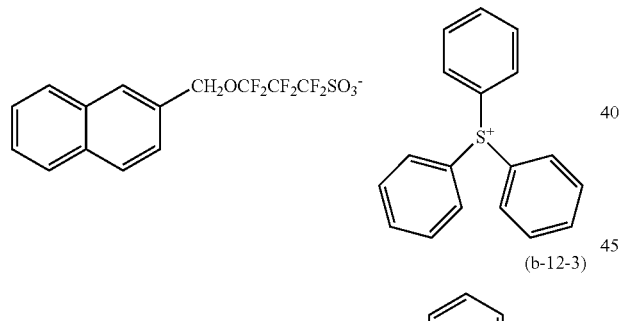

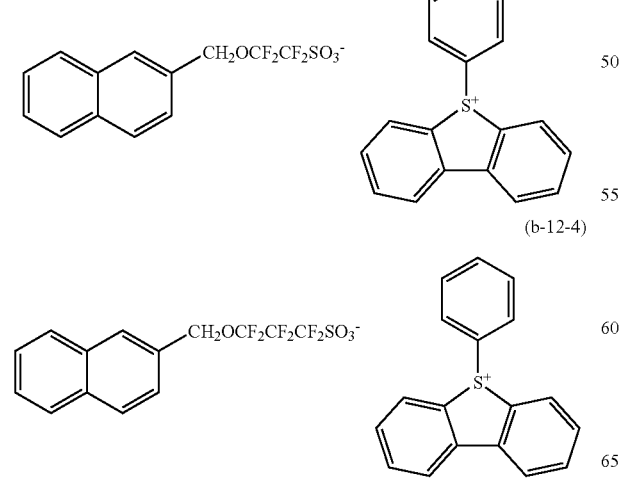

[Chemical Formula 35]

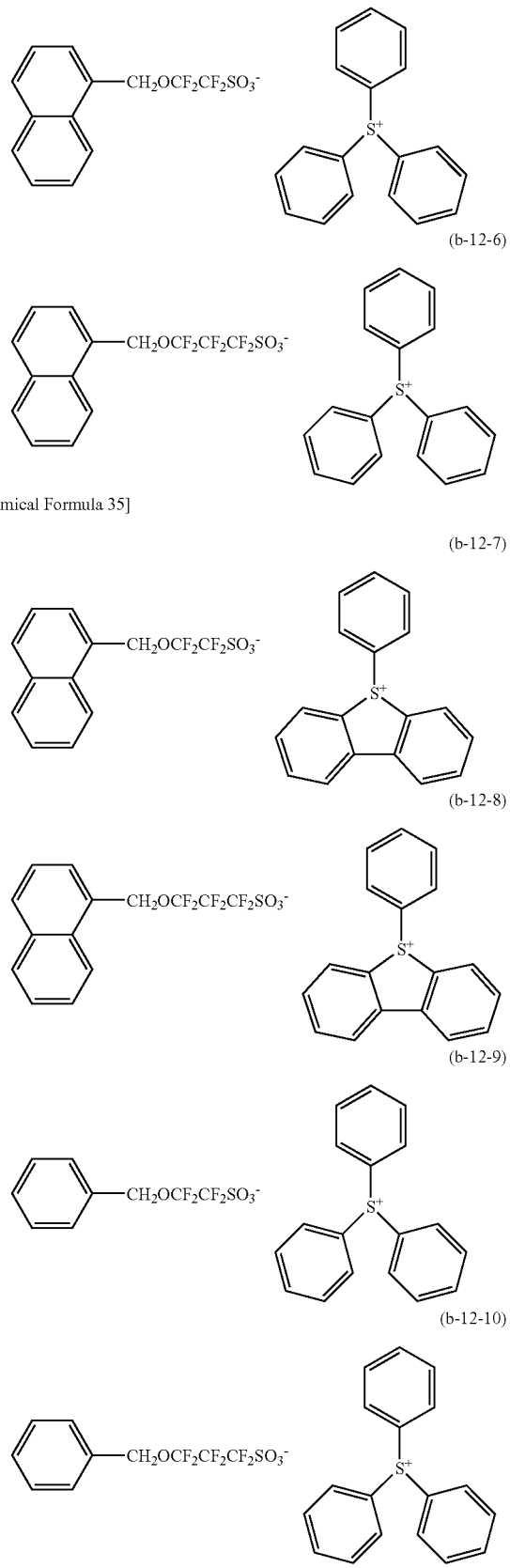

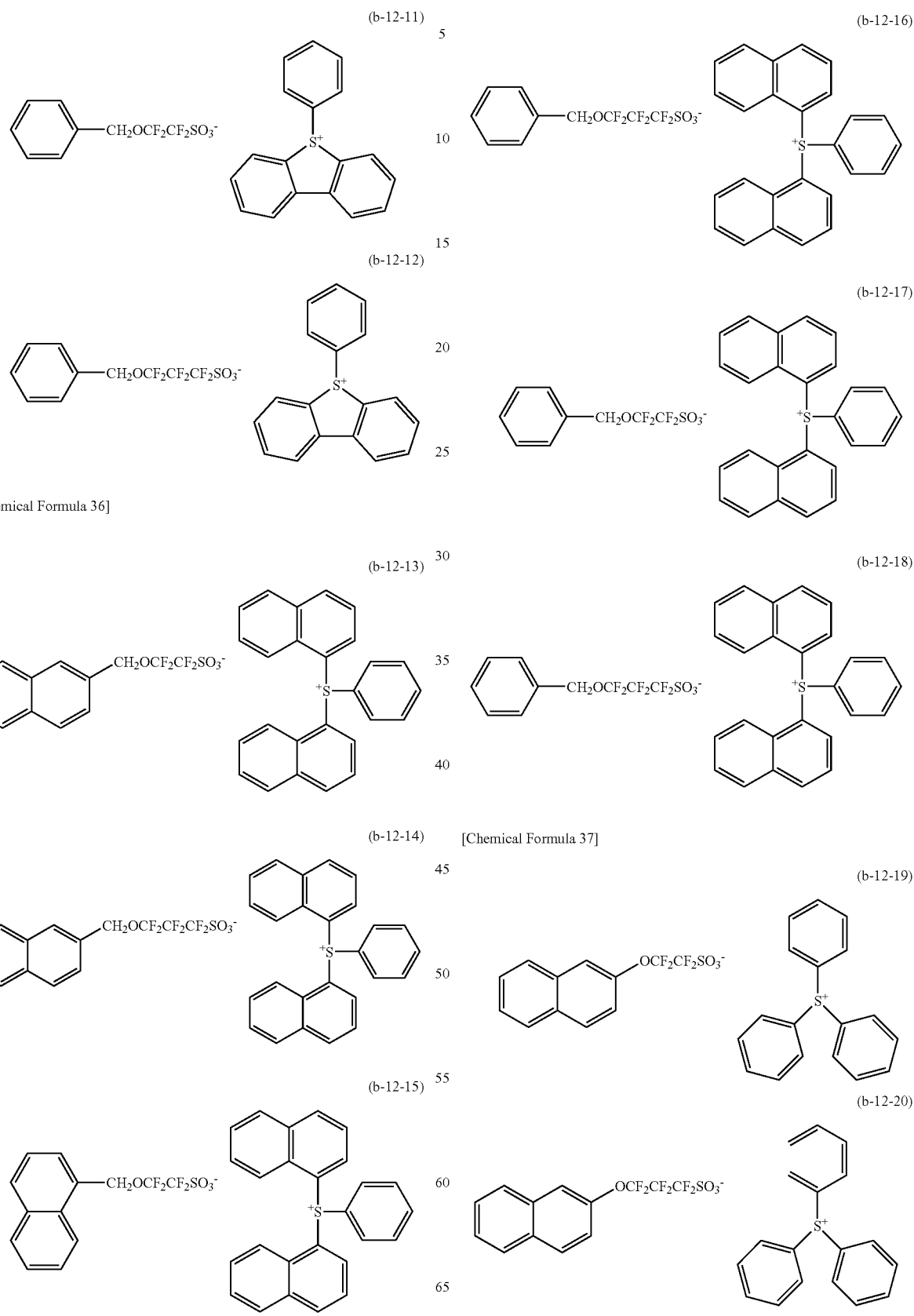

-continued (b-12-21)
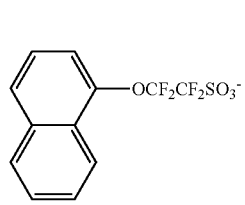

(b-12-22)
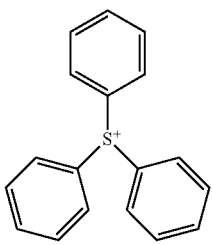

(b-12-23)

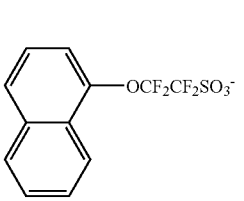

(b-12-24)

[Chemical Formula 38]

(b-12-25)

(b-12-26)

-continued (b-12-27)
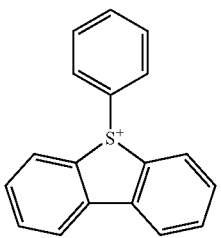

(b-12-28)

(b-12-29)
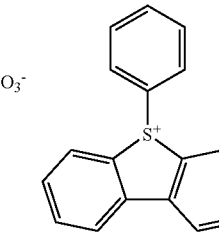

(b-12-30)
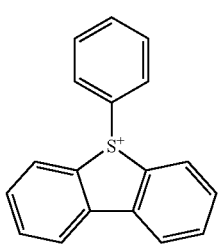

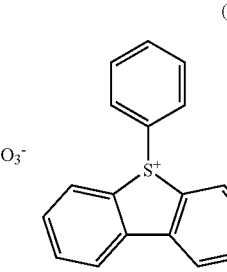

—Synthesis Method of Component (B1)

The component (B1) can be produced, for example, as follows. A compound represented by general formula (b1-12-103) shown below is reacted with lithium hydroxide in an organic solvent such as tetrahydrofuran, acetone or methyl ethyl ketone, to obtain a compound represented by general formula (b1-12-104) shown below. Then, the obtained compound is reacted with a halogenide of a desired cation $A^+$ (e.g., $A^+Br^-$) in an aqueous solution, thereby obtaining the component (B1).

[Chemical Formula 39]

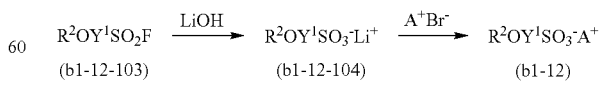

(b1-12-103)  (b1-12-104)  (b1-12)

wherein $R^2$, $Y^1$ and $A^+$ are as defined for $R^2$, $Y^1$ and $A^+$ in general formula (b1-12) above.

The compound represented by general formula (b1-12-103) above can be produced, for example, by referring to the method described in Example 1 of Published Japanese Translation No. Hei 11-502543 of the PCT International Publication. Specifically, for example, silver fluoride (AgF), a compound represented by general formula (b1-12-101) shown below and a compound represented by general formula (b1-12-102) shown below can be reacted in an organic solvent such as diglyme anhydride, thereby obtaining the compound represented by general formula (b1-12-103).

[Chemical Formula 40]

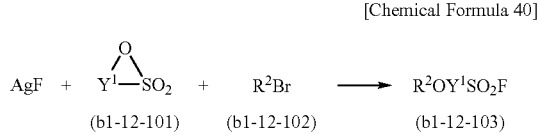

(b1-12-101)  (b1-12-102)  (b1-12-103)

wherein $R^2$ and $Y^1$ are as defined for $R^2$ and $Y^1$ in general formula (b1-12) above.

The compound represented by general formula (b1-12-102) can be produced, for example, by a method described in Japanese Unexamined Patent Application, First Publication No. 2006-348382 or U.S. Pat. No. 6,624,328 B1. In consideration of the availability of the compound represented by general formula (b1-12-101), the alkylene group for $Y^1$ which may be fluorinated preferably has 2 to 4 carbon atoms, more preferably 2 or 3, and most preferably 2.

As the component (B1), one type of the compound represented by general formula (b1-12) may be used, or two or more types may be used in combination. As the component (B1), it is preferable to use an acid generator containing at least one compound selected from the group consisting of compounds represented by general formulas (b-12-1) to (b-12-30), more preferably an acid generator containing at least one compound selected from the group consisting of compounds represented by general formulas (b-12-1) to (b-12-18), most preferably an acid generator containing the compound represented by general formula (b-12-1).

The amount of the component (B1) within the entire component (B) is preferably 40% by weight or more, more preferably 70% by weight or more, and may be even 100% by weight. It is particularly desirable that the amount of the component (B1) within the entire component (B) is 100% by weight. By making the amount of the component (B1) at least as large as the lower limit of the above-mentioned range, when a resist pattern is formed using the positive resist composition of the present invention, the mask reproducibility is improved, and the lithography properties become excellent.

In the component (B), an acid generator (B2) other than the aforementioned component (B1) (hereafter, referred to as "component (B2)") may be used in combination with the component (B1).

As the component (B2), there is no particular limitation as long as it is an acid generator other than the component (B1), and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone based acid generators.

As an onium salt-based acid generators a compound represented by general formula (b'-1) or (b'-2) shown below can be used.

[Chemical Formula 41]

wherein $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b'-1) my be bonded to each other to form a ring with the sulfur atom; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In general formula (b'-1), $R^{1\prime\prime}$ to $R^{3\prime\prime}$ are as defined for $R^{1\prime\prime}$ to $R^{3\prime\prime}$ in general formula (b-1) above.

In general formula (b'-1), $R^{4\prime\prime}$ represents a linear branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$ having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group percentage of fluorine atoms within the alkyl group) is preferably from 10 to 100%, more preferably from 50 to 100%, and it is particularly desirable that all hydrogen atoms are substituted with fluorine atoms (the fluorinated alkyl group is a perfluoroalkyl group) because the acid strength increases.

$R^{4\prime\prime}$ is most preferably a linear or cyclic alkyl group or fluorinated alkyl group.

In general formula (b'-2), $R^{4\prime\prime}$ is as defined for $R^{4\prime\prime}$ in general formula (b'-1).

In general formula (b'-2), $R^{5\prime\prime}$ and $R^{6\prime\prime}$ are respectively as defined for $R^{5\prime\prime}$ and $R^{6\prime\prime}$ in general formula (b'-1).

Specific examples of suitable onium salt-based acid generators represented by formula (b'-1) or (b'-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate heptafluoropropanesulfonate or nonafluorobutanesulfonate; 1-phenyltetrahydrothiophenium trifluoromethanesulfonate, heptafluoropropanesulfonate or nonafluorobutanesulfonate 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b'-1) or (b'-2) is replaced by an anion moiety represented by general formula (b-3) or (b-4) shown below (the cation moiety is the same as (b'-1) or (b'-2)) may be used.

[Chemical Formula 42]

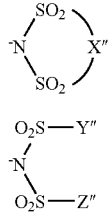

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) above may be used.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b'-1) or (b'-2) shown above, and anion moieties represented by general formula (b-3) or (b-4) shown above. Among these, fluorinated alkylsulfonic acid ions are preferable, more preferably fluorinated alkylsulfonic acid ions of 1 to 4 carbon atoms, and linear perfluoroalkylsulfonic acid ions of 1 to 4 carbon atoms are particularly desirable. Specific examples include a trifluoromethylsulfonic acid ion, heptafluoro-n-propylsulfonic ion and nonafluoro-n-butylsulfonic acid ion.

In the present description, an oximesulfonate-based acid generator is a compound having at least one group represented by general formula (B-1) shown below, and has a feature of generating acid by in irradiation. Such oximesulfonate-based acid generators are widely used for a chemically amplified resist composition, and can be appropriately selected.

[Chemical Formula 43]

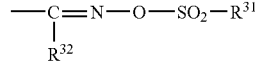

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 44]

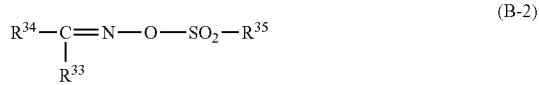

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 45]

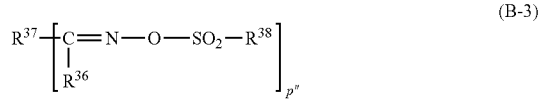

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(trifluoromethylsulfonyloxyimino)-1-cyclohexyl acetonitrile, α-(trifluoromethylsulfonyloxyimino)-cyclopentenyl acetonitrile, α-(trifluoromdhfylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 46]

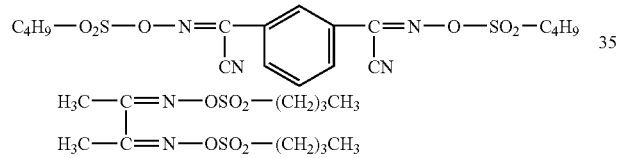

[Chemical Formula 47]

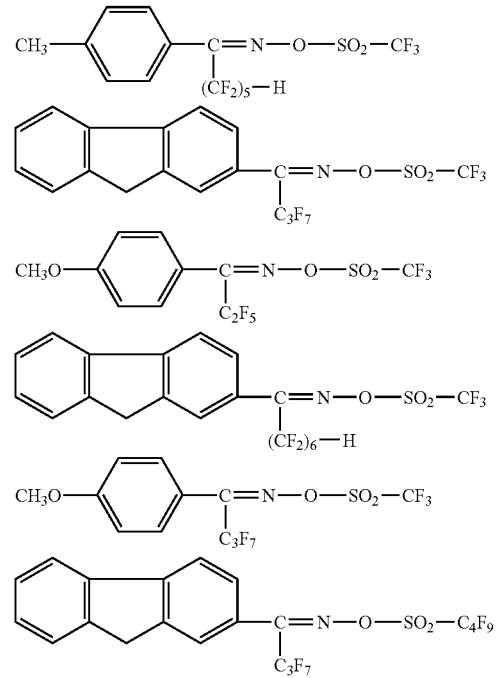

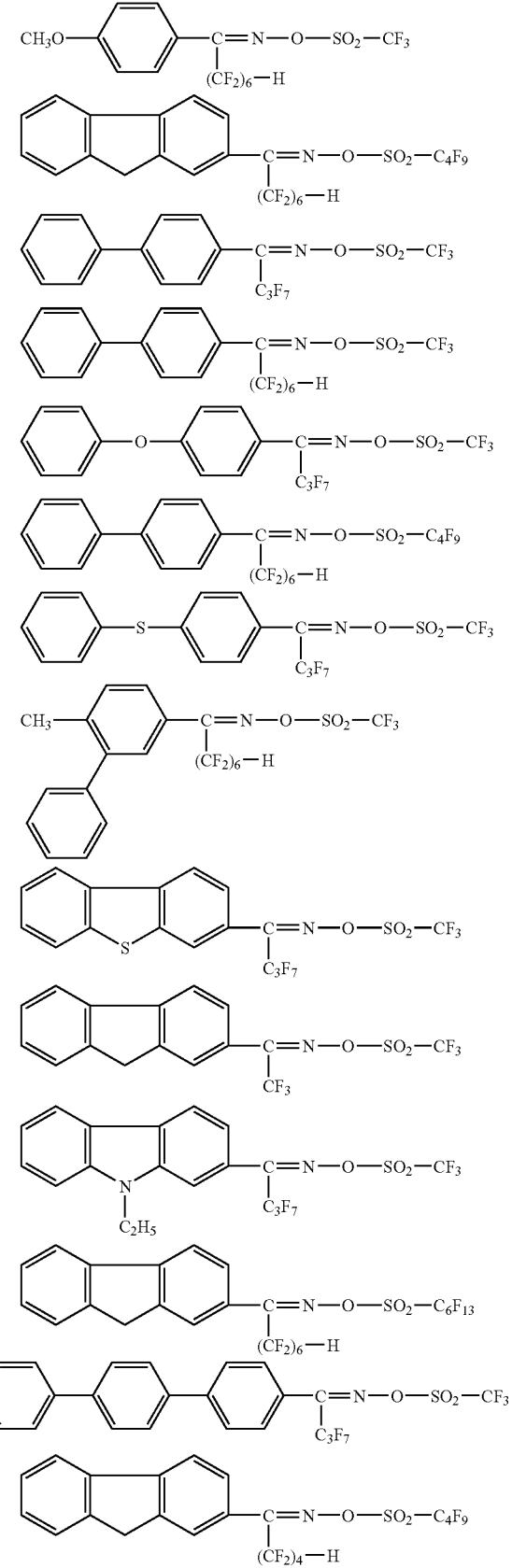

Among the above-exemplified compounds, the following 4 compounds are preferable.

[Chemical Formula 48]

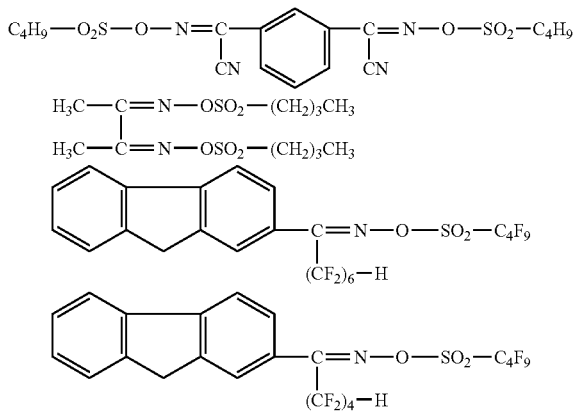

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis (phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be exemplified.

As the component (B2), one type of acid generator may be used, or two or more types may be used in combination.

The total amount of the component (B) within the resist composition of the present invention is 0.5 to 50 parts by weight, and preferably 1 to 30 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>
—Component (D)

In the positive resist composition of the present invention, for improving the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although a cyclic amine, an aliphatic amine, and particularly a secondary aliphatic amine or tertiary aliphatic amine is preferable.

The term "aliphatic cyclic group" refers to a monocyclic group or polycyclic group that has no aromaticity. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines).

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, trialkylamines of 5 to 10 carbon atoms are preferable, tri-n-pentylamine and tri-n-octylamine are more preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

—Component (E)

Furthermore, in the positive resist composition of the present invention, for preventing any deterioration in sensitivity, and improving the resist pattern shape and the post exposure stability of the latent image formed by the pattern-wise exposure of the resist layer, at least one compound (E) hereafter referred to as the component (E) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

—Component (S)

The positive resist composition according to the first aspect of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane, esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent the PCGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight and preferably from 5 to 15% by weight.

The positive resist composition of the present invention enables formation of a contact hole (C/H) pattern with excellent lithography properties such as excellent uniformity of the hole diameter and circularity of the holes. The reasons for this has not yet been elucidated, but are presumed as follows.

In the positive resist composition of the present invention, a component (A) having the structural unit (a1) represented by general formula (a1-0-2) is used, and the component (B1) is used as a component (B). The anion moiety of the compound represented by general formula (b1-12) as the component (B1) has an aromatic organic group-containing functional group "$R^2$—O" introduced into the skeleton "$Y^1$—$SO_3$", and has a three-dimensionally bulky structure, as compared to a fluorinated alkylsulfonic acid ion which has been conventionally used as the anion moiety. By virtue of such a structural feature of the skeleton "$Y^1$—$SO_3$" even though $Y^1$ (an alkylene group which may be fluorinated) only has 1 to 4 carbon atoms, when the compound represented by general formula (b1-12) is used as an acid generator, excess diffusion of acid generated in exposed regions to unexposed regions can be suppressed, as compared to an acid generator having a conventional anion moiety such as nonafluoro-n-butanesulfonate. As a result, the difference in alkali solubility between unexposed regions and exposed regions (dissolution contrast) is improved, and hence, the mask reproducibility of a resist pattern formed is improved.

Especially, by using a resin component having the structural unit (a1) represented by general formula (b1-12) in combination with the acid generator (component (B1)), it is presumed that the CDU and circularity of the holes of a C/H pattern formed are significantly improved.

"CDU" indicates the fluctuation of the diameter of holes present within a predetermined range, and "circularity" indicates the fluctuation of the diameter of a single hole. Both of the CDU and the circularity are parameters for indicating how fairly a C/H pattern can be reproduced (mask reproducibility).

<<Method of Forming a Resist Pattern>>

Next, the method of forming a resist pattern according to the second aspect of the present invention will be described.

The method of forming a resist pattern according to the present invention includes: applying a positive resist composition of the first aspect of the present invention to a substrate to form a resist film on the substrate; conducting exposure of the resist film; and alkali-developing the resist film to form a resist pattern.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide, preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) can be exemplified.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition according to the first aspect of the present invention is effective to KrF excimer laser, ArF excimer laser, EB and EUV, and particularly effective to ArF excimer laser.

EXAMPLES

As follows is a description of examples of the present invention, although the scope of the present invention is by no way limited by these examples.
<Synthesis of Compound (b1-12-1)>

[Chemical Formula 49]

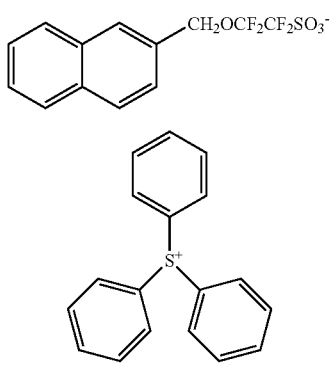

(b-12-1)

16.7 ml of tetrahydrofuran was added to 5.0 g of 2-naphthylmethyloxytetrafluoroethanesulfonylfluoride (1), and an aqueous solution obtained by dissolving 0.98 g of lithium hydroxide in 13.6 ml of pure water was dropwise added to the resulting solution in an ice bath. Then, the solution was stirred in the ice bath. As no absorption by —SO$_2$F was observed at –217.6 ppm by $^{19}$F-NMR, it was confirmed that all fluorinated sulfonyl groups were converted to lithium sulfonate. Thereafter, the reaction liquid was concentrated and dried to obtain a viscous white solid (crude product). The obtained crude product was dissolved in 14.2 ml of acetone, and filtered to remove the by-produced LiF. The filtrate was concentrated, thereby obtaining 5.50 g of a precursor compound (2).

[Chemical Formula 50]

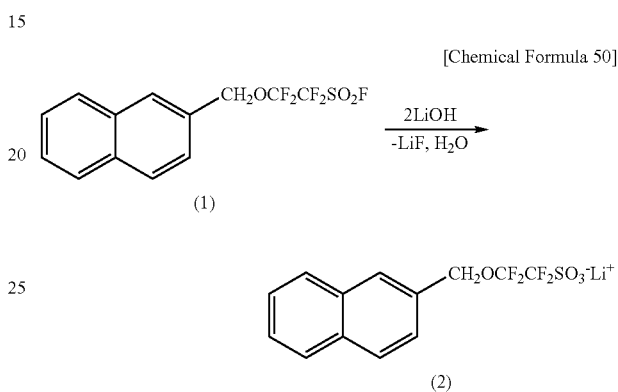

Subsequently, 6.99 g of triphenylsulfonium bromide was dissolved in 125 ml of pure water. 5.50 g of the precursor compound (2) was added to the resulting solution, and stirred at room temperature for 19 hours. Then, 125 g of dichloromethane was added thereto and stirred, and the organic phase was separated and taken out. The organic phase was washed with 40 ml of pure water, and the organic phase was separated and taken out. The obtained organic phase was concentrated and dried, thereby obtaining 7.09 g of the objective compound (3) (yield: 75.2%).

[Chemical Formula 51]

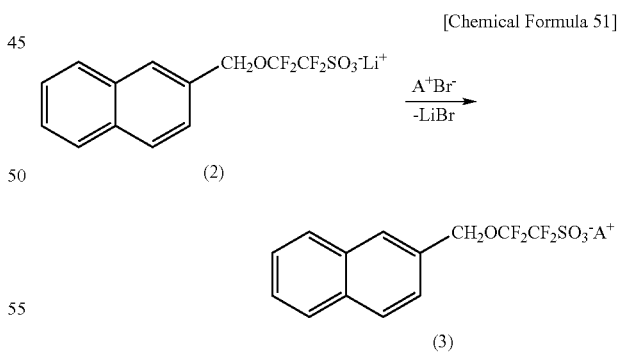

wherein A$^+$ is triphenylsulfonium.

The compound (3) was analyzed by NMR.

$^1$H-NMR (acetone-d$_6$, 400 MHz): δ(ppm)=8.01-7.47 (m, 22H, H$^a$), 5.23 (s, 2H, H$^b$).

$^{19}$F-NMR (acetone-d6, 376 MHz): δ(ppm)=79.2, 111.8.

From the results shown above, it was confirmed that the compound had a structure shown below.

[Chemical Formula 52]

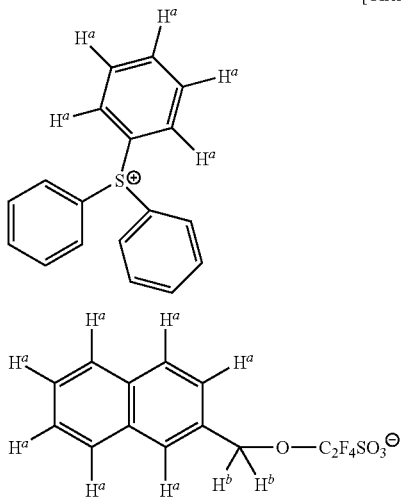

<Synthesis of Copolymer (A)-1>

Using the monomers represented by formulas (1) to (3) shown below, a copolymer (A)-1 was synthesized by a conventional dropwise polymerization method. The weight average molecular weight (Mw) was 10,000, and the dispersity (Mw/Mn) was 2.0. The Mw and Mw/Mn of the copolymer (A)-1 were determined by the polystyrene equivalent value as measured by gel permeation chromatography (GPC). The compositional ratio (molar ratio) of the respective structural units within the copolymer was l/m/n=4/4/2. The compositional ratio was determined by $^{13}$C-NMR.

[Chemical Formula 53]

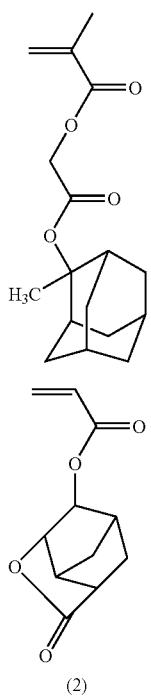

[Chemical Formula 54]

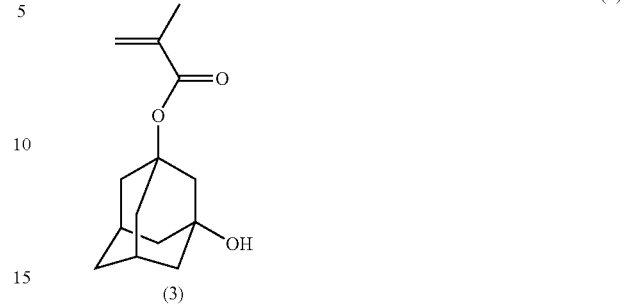

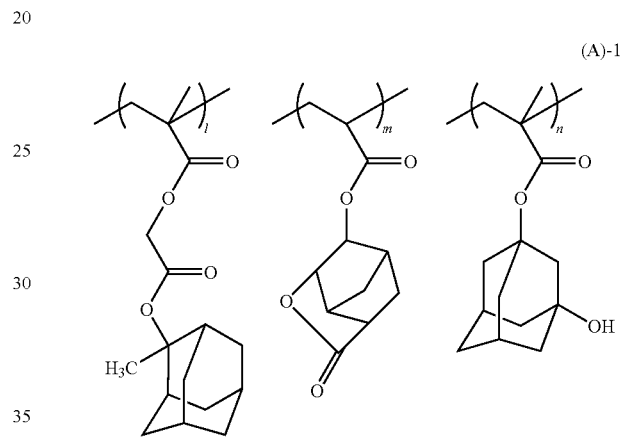

<Synthesis of Copolymer (A)-2>

Using the monomers represented by formulas (1'), (2) and (3) shown below, a copolymer (A)-2 was synthesized by a conventional dropwise polymerization method. The weight average molecular weight (Mw) was 10,000, and the dispersity (Mw/Mn) was 2.0. The Mw and Mw/Mn of the copolymer (A)-2 were determined by the polystyrene equivalent value as measured by gel permeation chromatography (GPC). The compositional ratio (molar ratio) of the respective structural units within the copolymer was l'/m/n=4/4/2. The compositional ratio was determined by $^{13}$C-NMR,

[Chemical Formula 55]

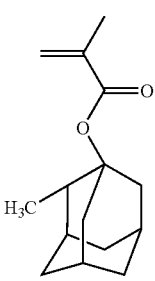

-continued (2)

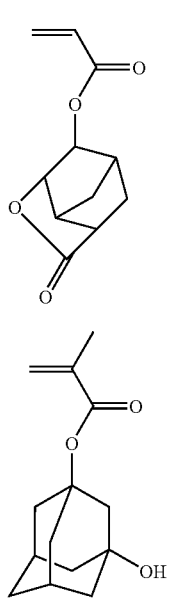

(3)

[Chemical Formula 56]

(A)-2

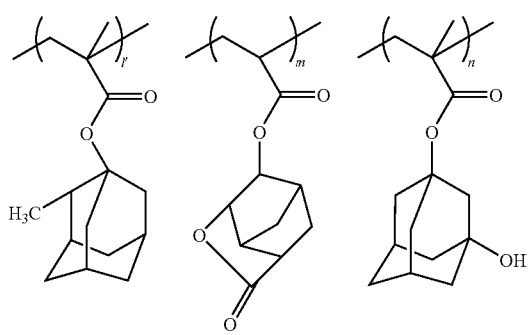

<Preparation of Positive Resist Compositions>

The components shown in Table 1 were mixed together and dissolved to obtain positive resist composition solutions.

TABLE 1

|  | Component (A) | Component (B) | Component (D) | Component (S) |
|---|---|---|---|---|
| Ex. 1 | (A)-1 [100] | (B)-1 [4.87] | (D)-1 [0.1] | (S)-1 [2380] |
| Comp. Ex. 1 | (A)-2 [100] | (B)-1 [4.87] | (D)-1 [0.1] | (S)-1 [2380] |

In Table 1, the reference characters indicate the following. Further, the values in brackets [ ] indicate the amount (in terms of parts by weight) of the component added.

(A)-1: a copolymer represented by formula (A)-1 above (A)-2: a copolymer represented by formula (A)-2 above (B)-1: an acid generator represented by chemical formula (b-12-1) above (D)-1: tri-n-pentylamine (S)-1: a mixed solvent of PGMEA/PGME=6/4 (weight ratio)

<Evaluation of Lithography Properties>

Using the obtained positive resist composition solutions, resist patterns were formed, and the following lithography properties were evaluated.

[Resolution-Sensitivity]

An organic anti-reflection film composition product name: ARC29A, manufactured by Brewer Science Ltd.) was applied onto an 8-inch silicon wafer using a spinner, and the composition was then baked at 205° C. for 60 seconds, thereby forming an organic anti-reflection film having a film thickness of 89 nm. Then, a positive resist composition solution obtained above was applied onto the anti-reflection film using a spinner, and was then prebaked (PAB) on a hotplate at 100° C. for 60 seconds and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 29 nm.

Thereafter, using an ArF exposure apparatus for immersion lithography (product name: NSR-S609B, manufactured by Nikon Corporation, NA (numerical aperture)=1.07, 2/3 annular illumination, reduction ratio: 1/4, immersion medium: water), the resist film having a top coat formed thereon was selectively irradiated with an ArF exciter laser (193 nm) through a mask having a hole pattern in which holes having a hole diameter (CD) of 75 nm are equally spaced (75 nm+bias, pitch: 131 nm).

Next, the top coat was removed using a protection-film removing solution (product name: TS-Rememover-S; manufactured by Tokyo Ohka Kogyo Co., Ltd.). Then, a post exposure bake (PEB) treatment was conducted at 95° C. for 60 seconds, followed by development for 30 seconds at 23° C. in a 2.38% by weight aqueous solution of tetramethylammonium hydroxide (product name: NMD-W; manufactured by Tokyo Ohka Kogyo Co., Ltd.). Then, the resist film was rinsed for 30 seconds with pure water, followed by drying by shaking.

As a result, a contact hole (C/H) pattern in which holes having a hole diameter (CD) of about 70 nm are equally spaced (pitch: 131 nm) was formed on the resist film.

Further, the optimum exposure dose (sensitivity: Eop, mJ/cm$^2$) with which the hole pattern was formed was determined. The results are shown in Table 2.

TABLE 2

| | Eop (mJ/cm$^2$) | |
|---|---|---|
| Bias | Ex. 1 | Comp. Ex. 1 |
| 2 nm | 57.0 | 49.0 |
| 4 nm | 50.0 | 42.0 |
| 6 nm | 42.0 | 37.0 |

[Evaluation of Mask Error Factor (MEF)]

With the above-mentioned Eop and using mask patterns having a mask size with a hole diameter of 77 nm, 79 nm and 81 nm, C/H patterns were formed targeting a hole diameter of 70 nm and a pitch of 131 nm. A graph was plotted, taking the mask size on the horizontal axis and the CD (diameter) of the formed hole on the vertical axis, and the gradient of the plotted line was determined as the MEF.

The MEF is a parameter that indicates how faithfully mask patterns of differing dimensions can be reproduced by using the same exposure dose with fixed pitch and changing the mask size (the hole diameter of a C/H pattern or the line width of a line and space pattern). As a result of evaluation, it was confirmed that the mask reproducibility in Example 1 was about the same level as that in Comparative Example 1.

[Evaluation of CDU]

With respect to each of the C/H patterns formed, the hole diameter (CD) of 25 holes were measured, and from the results, the value of 3 times the standard deviation σ (i.e., 3σ) was calculated as a yardstick of CD uniformity (CDU). The smaller this 3σ value is, the higher the level of CDU of the holes formed in the resist film.

[Evaluation of Circularity]

Each of the C/H patterns formed was observed from the upper side thereof using a scanning electron microscope (product name: S-9220, manufactured by Hitachi, Ltd.), and with respect to each of 25 holes, the distance from the center of the hole to the outer periphery thereof was measured in 24 directions. From the results, the value of 3 times the standard deviation σ (i.e., 3σ) was calculated as a yardstick of circularity. The smaller this 3σ value is, the higher the level of circularity of the holes.

TABLE 3

| | | 3σ | |
| --- | --- | --- | --- |
| | Bias | Ex. 1 | Comp. Ex. 1 |
| CDU | 2 nm | 14.11 | — |
| | 4 nm | 10.99 | 21.60 |
| | 6 nm | 11.02 | 12.39 |
| Circularity | 2 nm | 4.29 | — |
| | 4 nm | 5.44 | 5.51 |
| | 6 nm | 3.80 | 5.08 |

The results of the evaluations of CDU and circularity are shown in Table 3. In Table 3, "-" indicate that the shape of the holes was extremely poor, and the evaluation could not be performed.

In the C/H pattern obtained using the positive resist composition of Example 1, the values of 3σ for all of the bias were small as compared to those in the C/H pattern obtained using the positive resist composition of Comparative Example 1, and as a result, it was found that the CDU and circularity for each of the holes were excellent. Therefore, by using a positive resist composition of the present invention including a component (A) having the structural unit (a1) represented by general formula (a1-0-2) and the component (B1) as a component (B), it is apparent that a resist pattern with excellent lithography properties can be formed, especially a contact hole (C/H) pattern with holes having excellent CDU and circularity.

The invention claimed is:

1. A positive resist composition comprising a resin component (A) which exhibits increased solubility in an alkali developing solution under action of acid and an acid-generator component (B) which generates acid upon exposure,
said resin component (A) having a structural unit (a1) represented by general formula (a1-0-2) shown below:

[Chemical Formula 1]

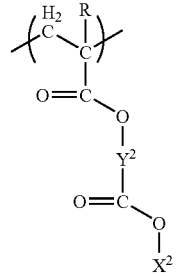

(a1-0-2)

wherein R represents a hydrogen atom, a lower alkyl group or a halogenated lower alkyl group; $X^2$ represents an acid dissociable, dissolution inhibiting group; and $Y^2$ represents an alkylene group or a divalent aliphatic cyclic group; and
said acid-generator component (B) comprising an acid generator (B1) consisting of a compound represented by general formula (b1-12) shown below:

$$R^2-O-Y^1-SO_3^-A^+ \quad (b1\text{-}12)$$

wherein $R^2$ a naphthylmethyl group; $Y^1$ represents an alkylene group of 1 to 4 carbon atoms which may be substituted with a fluorine atom; and $A^+$ represents a cation.

2. The positive resist composition according to claim 1, wherein said resin component (A) further has a structural unit (a2) derived from an acrylate ester having a lactone-containing cyclic group.

3. The positive resist composition according to claim 1, wherein said resin component (A) further has a structural unit (a3) derived from an acrylate ester having a polar group-containing aliphatic hydrocarbon group.

4. The positive resist composition according to claim 1, which further comprises a nitrogen-containing organic compound (D).

5. A method of forming a resist pattern, comprising: applying a positive resist composition of any one of claims 1 to 4 to a substrate to form a resist film on the substrate; conducting exposure of said resist film; and alkali-developing said resist film to form a resist pattern.

* * * * *

UNITED STATES PATENT AND TRADEMARK OFFICE
CERTIFICATE OF CORRECTION

PATENT NO. : 7,741,009 B2
APPLICATION NO. : 12/174804
DATED : June 22, 2010
INVENTOR(S) : Dazai et al.

It is certified that error appears in the above-identified patent and that said Letters Patent is hereby corrected as shown below:

| | | |
|---|---|---|
| Page 1, (Item 56), Column 2, | Line 1 | Under Foreign Patent Documents, change "11-502543" to --H11-502543--. |
| Column 3 | Line 33 (Approx.) | Change "abovementioned" to --above-mentioned--. |
| Column 4 | Line 5 | After "pattern" insert --,--. |
| Column 4 | Line 13 | Change "father" to --further--. |
| Column 6 | Line 4 | Change "aliphatic cyclic groups" to --"aliphatic cyclic group"--. |
| Column 6 | Line 17 (Approx.) | After "norbornane" insert --,--. |
| Column 7 | Line 66 | Change "exposures" to --exposure,--. |
| Column 8 | Line 1 | Change "atoms" to --atom--. |
| Column 8 | Line 66 | Change "allyl" to --alkyl--. |
| Column 10 (Chemical Formula 6) (a1-3-3) | Line 47-67 (Approx.) | Change " 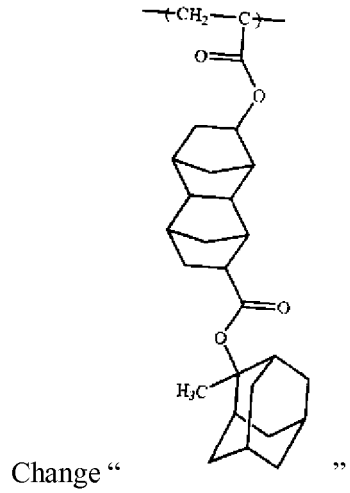 " |

Signed and Sealed this
Twenty-second Day of March, 2011

David J. Kappos
*Director of the United States Patent and Trademark Office*

CERTIFICATE OF CORRECTION (continued)
U.S. Pat. No. 7,741,009 B2 to -- 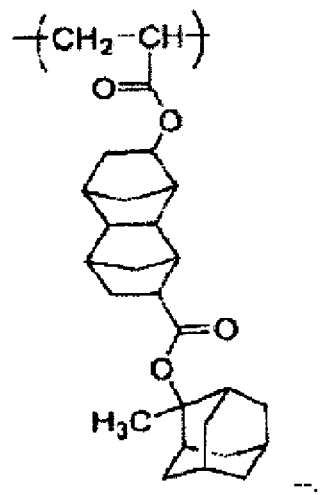 --.

Column 11      Line 1-20
(Chemical Formula 6)   (Approx.)
(a1-3-4)

Change " 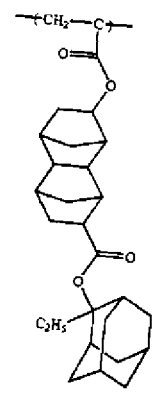 "

to -- 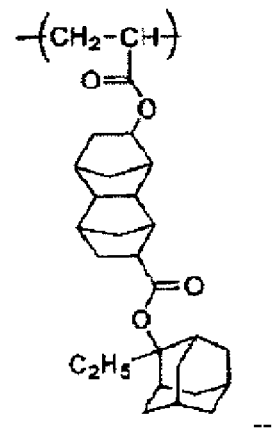 --.

CERTIFICATE OF CORRECTION (continued)
U.S. Pat. No. 7,741,009 B2

Column 12      Line 49-65
(Chemical Formula 6)    (Approx.)
(a1-3-9)

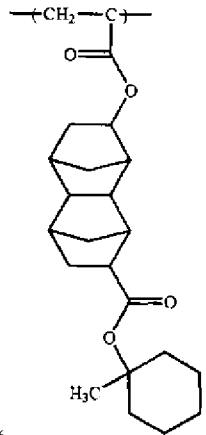

Change "            "

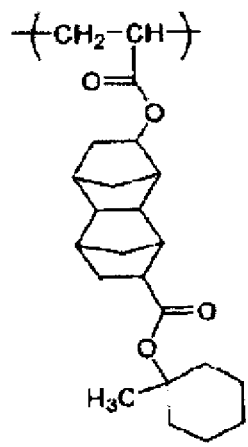

to --            --.

Column 13      Line 1-20
(Chemical Formula 6)    (Approx.)
(a1-3-10)

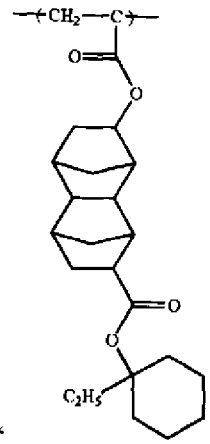

Change "            "

CERTIFICATE OF CORRECTION (continued)
U.S. Pat. No. 7,741,009 B2

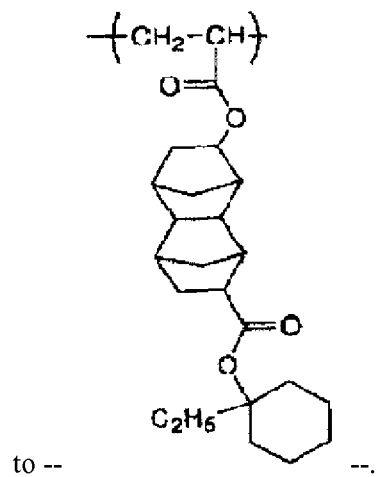

to --                                            --.

Column 13           Line 26-45
(Chemical Formula 6)   (Approx.)
(a1-3-11)

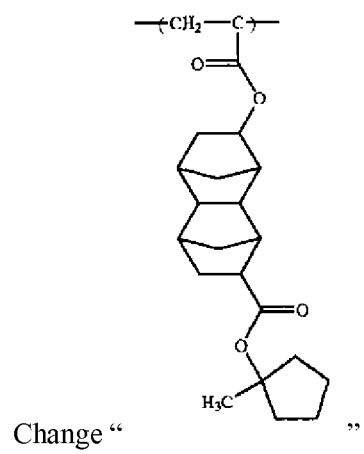

Change "                                         "

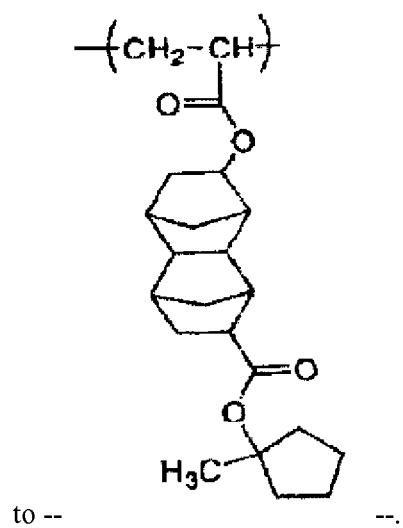

to --                                            --.

Column 13 Line 47-65
(Chemical Formula 6) (Approx.)
(a1-3-12)
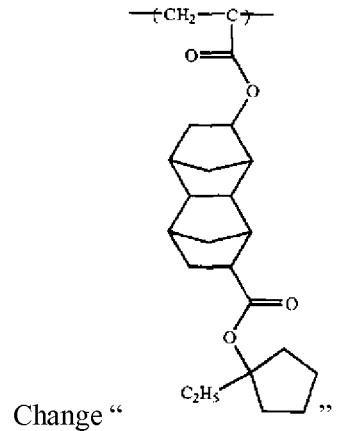
Change " " to " 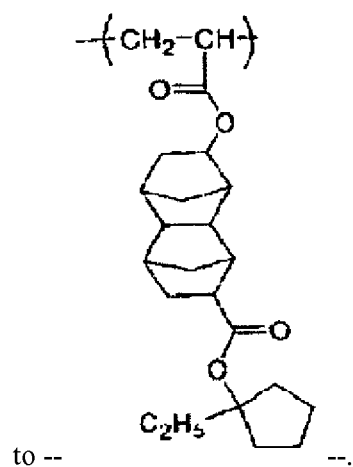 --.
Column 14 Line 50-65
(Chemical Formula 6) (Approx.)
(a1-3-15)
Change " 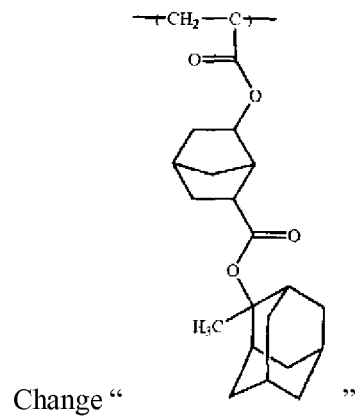 "

CERTIFICATE OF CORRECTION (continued)

U.S. Pat. No. 7,741,009 B2

Page 6 of 14

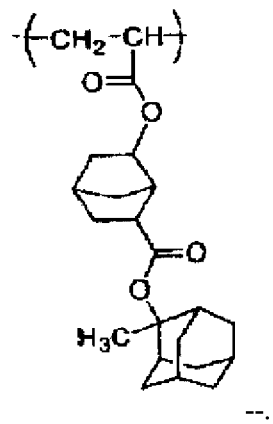

to --  --.

Column 15     Line 1-18
(Chemical Formula 6)     (Approx.)
(a1-3-16)

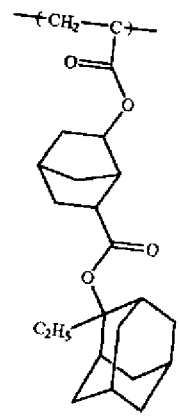

Change "                    "

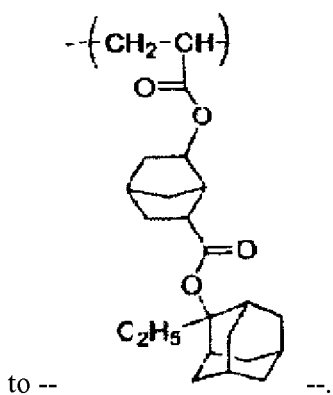

to --  --.

Column 16　　　　　Line 5-20
(Chemical Formula 7)　(Approx.)
(a1-3-19)
Change " 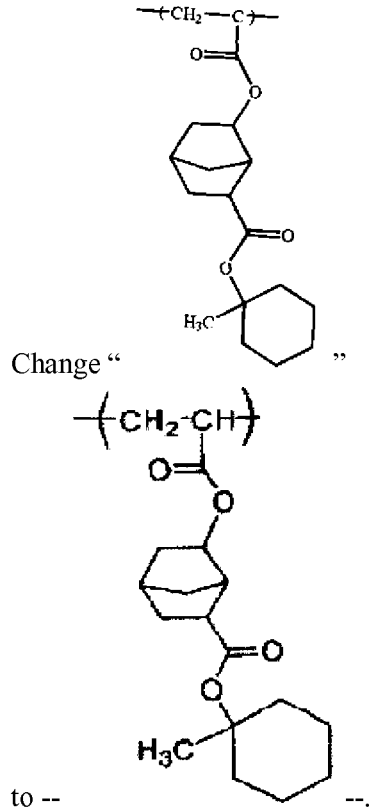 "
to -- --.
Column 16　　　　　Line 27-40
(Chemical Formula 7)　(Approx.)
(a1-3-20)
Change " 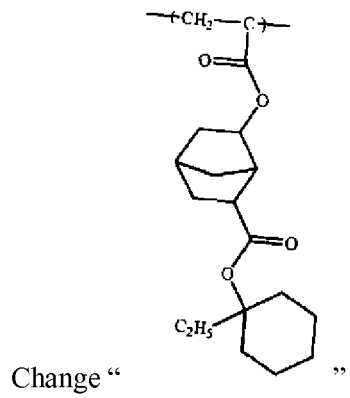 "

CERTIFICATE OF CORRECTION (continued)
U.S. Pat. No. 7,741,009 B2

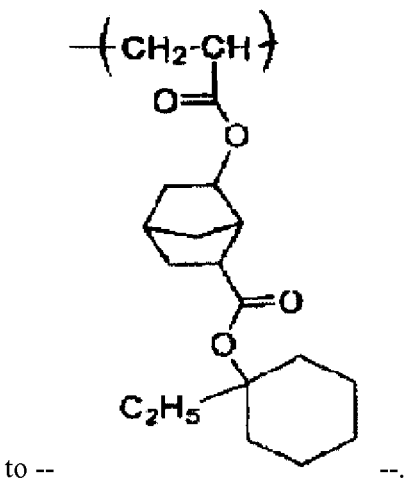

to --  --.

Column 17     Line 20-34
(Chemical Formula 7)   (Approx.)
(a1-3-23)

Change "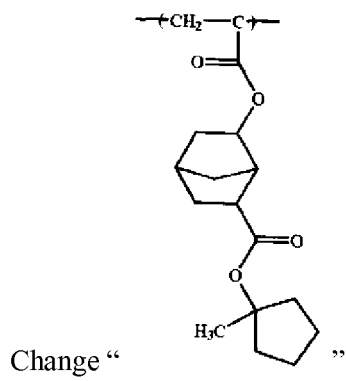"

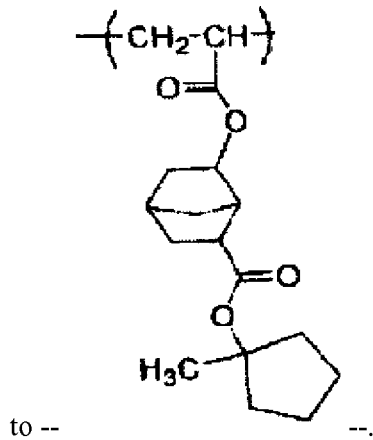

to --  --.

Column 17  Line 35-48
(Chemical Formula 7)  (Approx.)
(a1-3-24)
Change " 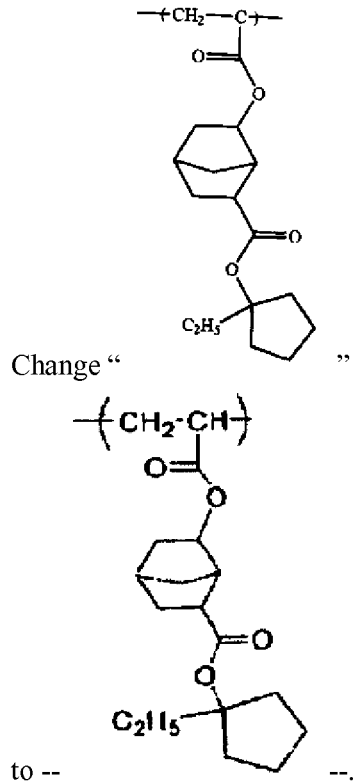 " to -- --.
Column 50  Line 25-34
(Chemical
Formula 22)  (Approx.)
(a1-1-02)
Change " 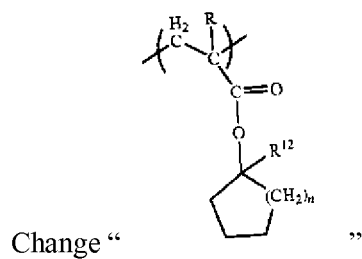 "

CERTIFICATE OF CORRECTION (continued)
U.S. Pat. No. 7,741,009 B2 to -- 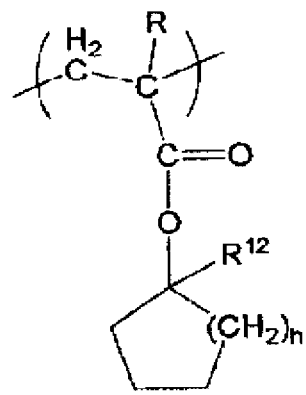 --.

| Column 52 | Line 15 | Change "all" to --alkyl--. |
| Column 52 | Line 32 | Change "(2-5)" to --(a2-5)--. |
| Column 55 (Chemical Formula 25) (a2-2-9) | Line 1-14 (Approx.) | |

Change " 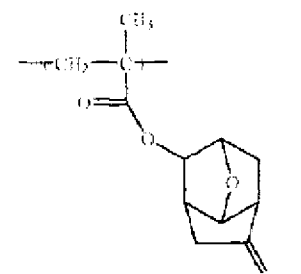 "

to -- 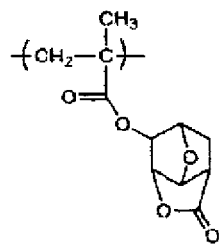 --.

Column 55 (Chemical Formula 25) (a2-2-10)     Line 15-24 (Approx.)

Change " 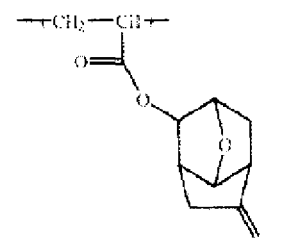 "

| | | |
|---|---|---|
| Column 61 (Chemical Formula 29) (a3-3) | Line 1-18 (Approx.) | Change " 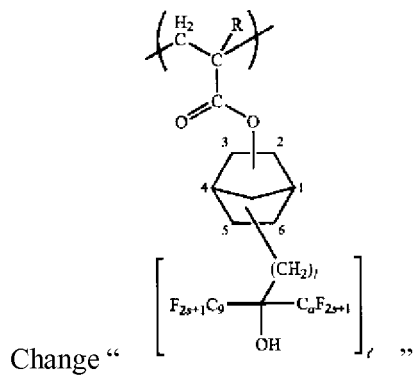 " to -- 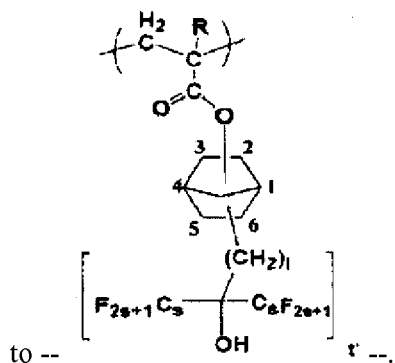 --. |
| Column 61 | Line 28 (Approx.) | Change "3-rd" to --3rd--. |
| Column 61 | Line 45 (Approx.) | Change "A" to --,--. |
| Column 62 | Line 4-5 | Change "desirable," to --desirable.--. |
| Column 63 | Line 44 | Change "$(CF_2)_2$" to --$(CF_3)_2$--. |
| Column 64 | Line 21 (Approx.) | After "and" insert --a--. |
| Column 64 | Line 32 (Approx.) | After "iodine atom" insert --,--. |
to -- 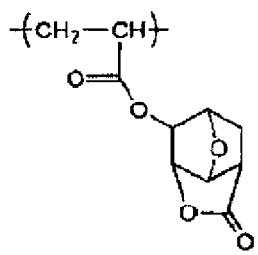 --.

CERTIFICATE OF CORRECTION (continued)
U.S. Pat. No. 7,741,009 B2

| Column 65 | Line 8 | After "(b-1)" insert --,--. |
| Column 65<br>(Chemical<br>Formula 32)<br>(b-2) | Line 16-20<br>(Approx.) | |

Change " 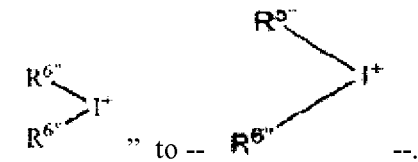 " to -- --.

| Column 65 | Line 60<br>(Approx.) | Change "group," to --group;--. |
| Column 65 | Line 62<br>(Approx.) | Change "less," to --less;--. |
| Column 66 | Line 6 | Change "a" to --an--. |
| Column 67 | Line 15 | After "1" insert --.--. |
| Column 67<br>(Chemical<br>Formula 34)<br>(b-12-2) | Line 35-45<br>(Approx.) | |

Change " 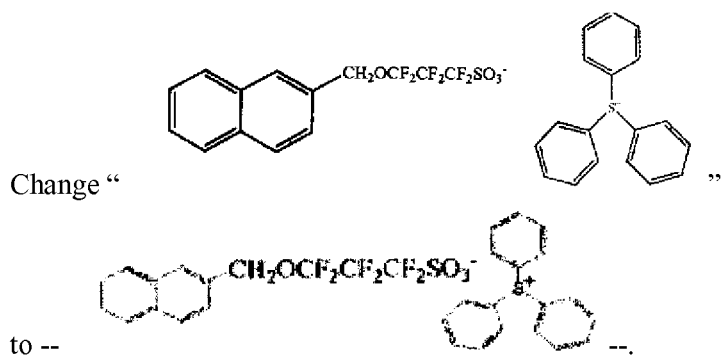

to -- --.

| Column 70<br>(Chemical<br>Formula 36)<br>(b-12-16) | Line 5-15<br>(Approx.) | |

Change " 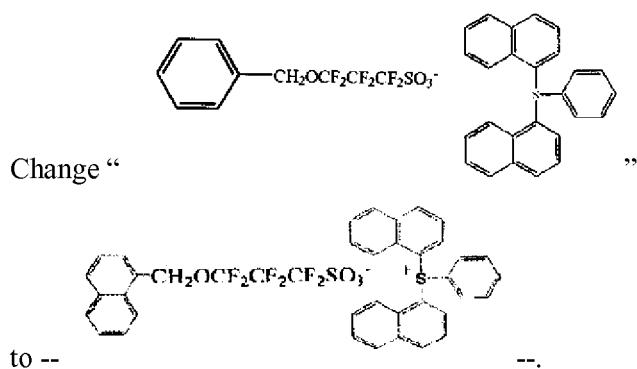

to -- --.

| | | |
|---|---|---|
| Column 70 (Chemical Formula 37) (b-12-20) | Line 57-65 (Approx.) | Change " 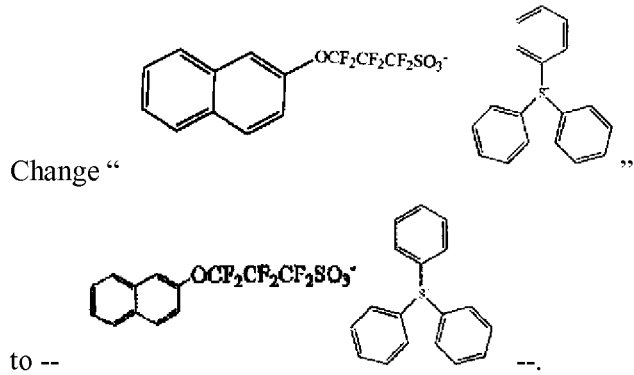 to -- -- . |
| Column 72 | Line 53 (Approx.) | Change "A$^+$Br)" to --A$^+$Br$^-$)--. |
| Column 73 | Line 63 (Approx.) | Change "disulfone based" to --disulfone-based--. |
| Column 73 | Line 65 | Change "generators" to --generator,--. |
| Column 74 | Line 16 (Approx.) | Change "my" to --may--. |
| Column 74 | Line 23 (Approx.) | After "linear" insert --,--. |
| Column 74 | Line 29 (Approx.) | After "R$^{1''}$" insert --,--. |
| Column 74 | Line 35 (Approx.) | Change "percentage" to --(percentage--. |
| Column 75 | Line 5 | After "trifluoromethanesulfonate" insert --,--. |
| Column 75 | Line 8 | After "nonafluorobutanesulfonate" insert --;--. |
| Column 76 | Line 28 (Approx.) | Change "above," to --above;--. |
| Column 76 | Line 39 (Approx.) | After "acid by" delete "in". |
| Column 78-79 | Line 67 (Col. 78) Line 1 Col. 79) | Change "α-(trifluoromethylsulfonyloxyimino)-1-cyclohexyl acetonitrile," to --α-(methylsulfonyloxyimino)-1-cyclooctenyl acetonitrile,--. |
| Column 79 | Line 1 | After "(trifluoromethylsulfonyloxyimino)" insert --1--. |
| Column 79 | Line 2-3 | Change "(trifluoromdhfylsulfonyloxyiimino)" to --(trifluoromethylsulfonyloxyimino)--. |

CERTIFICATE OF CORRECTION (continued)
U.S. Pat. No. 7,741,009 B2

| | | |
|---|---|---|
| Column 79 (Chemical (Formula 47) | Line 40-44 (Approx.) | Change " 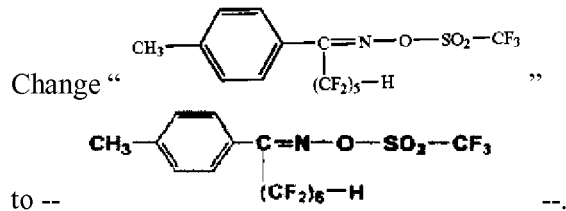 " to -- --. |
| Column 82 | Line 53 (Approx.) | Change "hereafter" to --(hereafter--. |
| Column 82 | Line 53 (Approx.) | Change "(E)" to --(E))--. |
| Column 83 | Line 48 (Approx.) | Change "dioxane," to --dioxane;--. |
| Column 84 | Line 4 | Change "solvent the PCGMEA" to --solvent, the PGMEA--. |
| Column 84 | Line 17 | After "weight" insert --,--. |
| Column 84 | Line 30 (Approx.) | Change "SO$_3$"," to --SO$_3$"--,--. |
| Column 84 | Line 33 (Approx.) | Change "SO$_3$"" to --SO$_3^-$"--. |
| Column 84 | Line 52 | Change "fairly" to --faithfully--. |
| Column 88 | Line 49 (Approx.) | Change "NMR," to --NMR.--. |
| Column 90 | Line 6 | Change "product" to --(product--. |
| Column 90 | Line 26 | Change "exciter" to --excimer--. |